United States Patent
Knopf et al.

(10) Patent No.: US 8,897,001 B2
(45) Date of Patent: Nov. 25, 2014

(54) DEVICES AND METHODS FOR ATTACHING COMPONENTS TO COMPUTER HOUSINGS

(71) Applicant: Apple Inc., Cupertino, CA (US)

(72) Inventors: Eric A. Knopf, Mountain View, CA (US); David P. Tarkington, Sunnyvale, CA (US); Houtan R. Farahani, San Ramon, CA (US)

(*) Notice: Subject to any disclaimer, the term of this patent is extended or adjusted under 35 U.S.C. 154(b) by 0 days.

(21) Appl. No.: 13/921,960

(22) Filed: Jun. 19, 2013

(65) Prior Publication Data

US 2013/0279107 A1 Oct. 24, 2013

Related U.S. Application Data

(63) Continuation of application No. 12/893,994, filed on Sep. 29, 2010, now Pat. No. 8,493,727.

(60) Provisional application No. 61/355,138, filed on Jun. 15, 2010, provisional application No. 61/355,144, filed on Jun. 16, 2010, provisional application No. 61/355,145, filed on Jun. 16, 2010, provisional application No. 61/355,150, filed on Jun. 16, 2010.

(51) Int. Cl.
| | |
|---|---|
| H05K 5/00 | (2006.01) |
| H05K 7/00 | (2006.01) |
| G06F 1/16 | (2006.01) |
| B26D 3/14 | (2006.01) |
| G06F 1/18 | (2006.01) |
| G06F 1/20 | (2006.01) |
| H05K 13/00 | (2006.01) |

(52) U.S. Cl.
CPC ........ *B26D 3/14* (2013.01); *G06F 1/181* (2013.01); *G06F 1/182* (2013.01); *G06F 1/203* (2013.01); *G06F 1/185* (2013.01); *G06F 1/187* (2013.01); *G06F 1/16* (2013.01); *H05K 13/00* (2013.01)
USPC ............ 361/679.34; 361/679.33; 361/679.35; 361/679.36; 361/679.58; 361/679.6

(58) Field of Classification Search
USPC .............. 361/679.6, 724, 725, 726, 727, 728, 361/753, 799, 800, 801, 679.34, 679.35, 361/679.36, 679.58; 312/223.1, 223.2, 312/223.3
See application file for complete search history.

(56) References Cited

U.S. PATENT DOCUMENTS

| | | | |
|---|---|---|---|
| 4,982,303 A | | 1/1991 | Krenz |
| 5,495,389 A | * | 2/1996 | Dewitt et al. ............ 361/679.57 |

(Continued)

FOREIGN PATENT DOCUMENTS

WO 2010/050971 5/2010

OTHER PUBLICATIONS

LPC-395F Fanless Mini PC with Removable Hard Drive and Compact Flash, http://www.stealth.com/littlepc_395_fanless.htm, Nov. 2009, 3 pgs.

*Primary Examiner* — Anthony Haughton
(74) *Attorney, Agent, or Firm* — Womble Carlyle Sandridge & Rice LLP

(57) ABSTRACT

An aesthetically pleasing small form factor desktop computer is described. The small form factor desktop computer can be formed of a single piece seamless housing that in the described embodiment is machined from a single billet of aluminum. In some embodiments, the housing includes a fastening system for securing and electrically grounding internal components to the housing. Fewer components and less time and effort can be required for assembly of the small form factor desktop computer and the absence of seams in the single piece housing can provide good protection against environmental contamination of internal components as well as EM shielding.

20 Claims, 34 Drawing Sheets

(56) References Cited

U.S. PATENT DOCUMENTS

| | | |
|---|---|---|
| 5,546,654 A | 8/1996 | Wojnarowski et al. |
| 5,820,236 A | 10/1998 | Aoki |
| 6,115,243 A * | 9/2000 | Horii ............ 361/679.09 |
| 6,172,870 B1 | 1/2001 | Novotny |
| 6,343,020 B1 * | 1/2002 | Lin et al. ............ 361/816 |
| 6,423,928 B1 | 7/2002 | Piwczyk |
| 6,459,576 B1 | 10/2002 | Bhatia et al. |
| 6,574,115 B2 | 6/2003 | Asano et al. |
| 6,639,796 B2 | 10/2003 | Cannon |
| 6,918,174 B2 | 7/2005 | Kim et al. |
| 6,919,532 B2 | 7/2005 | Swenson et al. |
| 6,985,355 B2 | 1/2006 | Allirot |
| 7,054,165 B2 | 5/2006 | Yi-Ling |
| 7,104,817 B2 | 9/2006 | Shiue et al. |
| 7,114,245 B2 | 10/2006 | Ogimoto |
| 7,177,161 B2 * | 2/2007 | Shima ............ 361/816 |
| 7,182,118 B2 | 2/2007 | Cheung et al. |
| 7,262,735 B2 | 8/2007 | Noe |
| 7,355,845 B2 | 4/2008 | Kim et al. |
| 7,455,915 B2 | 11/2008 | Johnson |
| 7,457,111 B2 | 11/2008 | Merz et al. |
| 7,724,532 B2 | 5/2010 | Zadesky et al. |
| 7,828,592 B2 | 11/2010 | Tobey et al. |
| 7,894,185 B2 | 2/2011 | Weber et al. |
| 7,911,387 B2 | 3/2011 | Hill et al. |
| 8,064,209 B2 * | 11/2011 | Masucci et al. ............ 361/752 |
| 8,250,724 B2 | 8/2012 | Dabov et al. |
| 8,390,999 B2 | 3/2013 | Neal et al. |
| 8,411,434 B2 | 4/2013 | Goh et al. |
| 2004/0174676 A1 | 9/2004 | Shi-Tsung |
| 2004/0246677 A1 | 12/2004 | Chen |
| 2004/0252455 A1 | 12/2004 | Yi-Lung |
| 2005/0002157 A1 * | 1/2005 | Frame et al. ............ 361/683 |
| 2005/0259389 A1 | 11/2005 | Lin |
| 2006/0181845 A1 * | 8/2006 | Shah et al. ............ 361/685 |
| 2007/0177294 A1 | 8/2007 | Adachi |
| 2007/0211422 A1 | 9/2007 | Liu et al. |
| 2010/0044855 A1 | 2/2010 | Eichelberger et al. |
| 2010/0091442 A1 | 4/2010 | Theobald et al. |
| 2012/0087065 A1 | 4/2012 | Kim et al. |

* cited by examiner

DEVICES AND METHODS FOR ATTACHING COMPONENTS TO COMPUTER HOUSINGS

CROSS-REFERENCE TO RELATED APPLICATIONS

This application is a continuation application that claims priority under 35 U.S.C. 120 to U.S. patent application Ser. No. 12/893,994, filed Sep. 29, 2010, entitled "Removable Hard Drive In A Small Form Factor Desk Top Computer," which claims priority under 35 U.S.C. 119(e) to each of U.S. Provisional Patent Application No. 61/355,138, filed Jun. 15, 2010, entitled "Small Form Factor Desktop Computer;" U.S. Provisional Patent Application No. 61/355,144, filed Jun. 16, 2010, entitled "Electronic Components In A Small Form Factor Desktop Computer;" U.S. Provisional Patent Application No. 61/355,145, filed Jun. 16, 2010, entitled "Cooling Arrangement For Small Form Factor Desktop Computer;" and U.S. Provisional Patent Application No. 61/355,150, filed Jun. 16, 2010, entitled "Manufacturing Fixtures For Small Form Factor Desktop Computer," each of which is incorporated by reference herein in its entirety and for all purposes.

BACKGROUND

1. Field of the Described Embodiments

The described embodiments relate generally to small form factor desktop computing devices. More particularly, enclosures of small form factor desktop computing devices and methods of assembling same are described.

2. Description of the Related Art

In recent years, small form factor desktop computers have been developed. These small form factor desktop computers provide basic computing services such as those provided by a central processing unit, or CPU, without the traditional I/O devices such as a keyboard and monitor usually associated with a standard desktop computer. By providing basic computer services, the small form factor desktop computer is affordable and can be easily customized for applications that would be unsuitable or at best difficult for the standard desktop computer. For example, the small form factor desktop computer can be easily placed on a shelf or in a cabinet and configured to operate as a media control center. In contrast to the small form factor desktop computer, in order to use the standard desktop computer as the media control center, a sturdy shelf or large cabinet must be used. Moreover, most people would not appreciate a standard desktop computer in plain view and would most likely opt to hide the unit. In this way, the small form factor desktop computer lends itself to applications that would otherwise be unsuitable for a standard desktop computer.

The reduction in size compared to standard desktop computers and the ease of use provide two reasons for the growing popularity of small form factor desktop computers. Factors that contribute to the reduction in size and ease of use can be attributed to the manufacturer's ability to fabricate various operational components in smaller and smaller sizes while increasing their power and/or operating speed. However, this trend of smaller, lighter and more powerful computers presents a continuing design challenge. One design challenge associated with the small form factor desktop computer is the design of the enclosure used to house the various internal components. This design challenge arises from a number conflicting design goals that includes the desirability of making the enclosure lighter and yet rugged and strong in addition to being aesthetically pleasing. Conventional approaches to making computer enclosures lighter rely upon the extensive use of plastic. Although the conventional plastic design is generally lighter, enclosures formed entirely of plastic tend to be more flexible and therefore less rugged. Therefore, in order to strengthen the housing and form a more rigid and rugged structure, thicker plastics are generally used. However, even though the increase in thickness is consistent with a stronger and more rugged enclosure, the thicker plastic adds weight and bulkiness that can lead to user dissatisfaction.

Computer enclosures are generally mechanical assemblies having multiple parts that are screwed, bolted, riveted, or otherwise fastened together at discrete points that can result in cracks, seams, gaps or breaks at the mating surfaces and fasteners located along the surfaces of the housing. For example, a mating line surrounding the entire enclosure is produced when using an upper and lower casing. Moreover, the various components and complicated processes used to manufacture the computer can make assembly a time consuming and cumbersome process requiring, for example, a highly trained assembly operator working with special tools.

In view of the foregoing, there is a need for improved component density and associated assembly techniques that reduce cost and improve outgoing quality. In addition, there is a need for improvements in the manner in which small form factor desktop computers are assembled such as improvements that enable structures to be quickly and easily installed within the enclosure.

SUMMARY OF THE DESCRIBED EMBODIMENTS

A small form factor desktop computer is disclosed. The small form factor desktop computer includes at least a single piece housing, a support structure attached to a front wall of the single piece housing, the support structure formed of vibration absorbing material and having at least two grommets, and a mass storage device. In the described embodiment, the mass storage device includes at least a body arranged to enclose and support a mass storage medium and associated mass storage device circuitry configured to access the mass storage medium and a plurality of support pins having a size and shape in accordance with the at last two grommets. The mass storage device is assembled into the small form factor desktop computer by inserting the mass storage device into the bottom opening, aligning the support pins with the at least two grommets, and inserting the support pins into the grommets in such a way that the mass storage device is removable.

A method can be performed by providing a single piece housing, attaching a support structure to a front wall of the single piece housing, the support structure formed of vibration absorbing material and having at least two grommets, providing a mass storage device, the mass storage device having a body arranged to enclose and support a mass storage medium and associated mass storage device circuitry configured to access the mass storage medium and a plurality of support pins attached to the body of the mass storage device having a size and shape in accordance with the at last two grommets. Inserting the mass storage device into a bottom opening of the single piece housing, aligning the support pins with the at least two grommets, and inserting the support pins into the grommets in such a way that the mass storage device is removable.

A mass storage device having a size in accordance with a small form factor desktop computer system is described. The mass storage device includes at least a mass storage device body, a mass storage data medium, the mass storage data medium configured to store digital data, a mass storage device circuit, the mass storage device circuit configured to provide access to the mass storage data medium, and a support pin integrally formed with the housing. In the described embodiment, the support pin is used to support the mass storage device such that the mass storage device is vibrationally isolated from other devices in the small form factor desktop computer and provides for easy discretionary insertion and removal of the mass storage device.

Other apparatuses, methods, features and advantages of the described embodiments will be or will become apparent to one with skill in the art upon examination of the following figures and detailed description. It is target that all such additional apparatuses, methods, features and advantages be included within this description be within the scope of and protected by the accompanying claims.

BRIEF DESCRIPTION OF THE DRAWINGS

The embodiments will be readily understood by the following detailed description in conjunction with the accompanying drawings, wherein like reference numerals designate like structural elements, and in which.

DESCRIBED EMBODIMENTS

Figure 1:
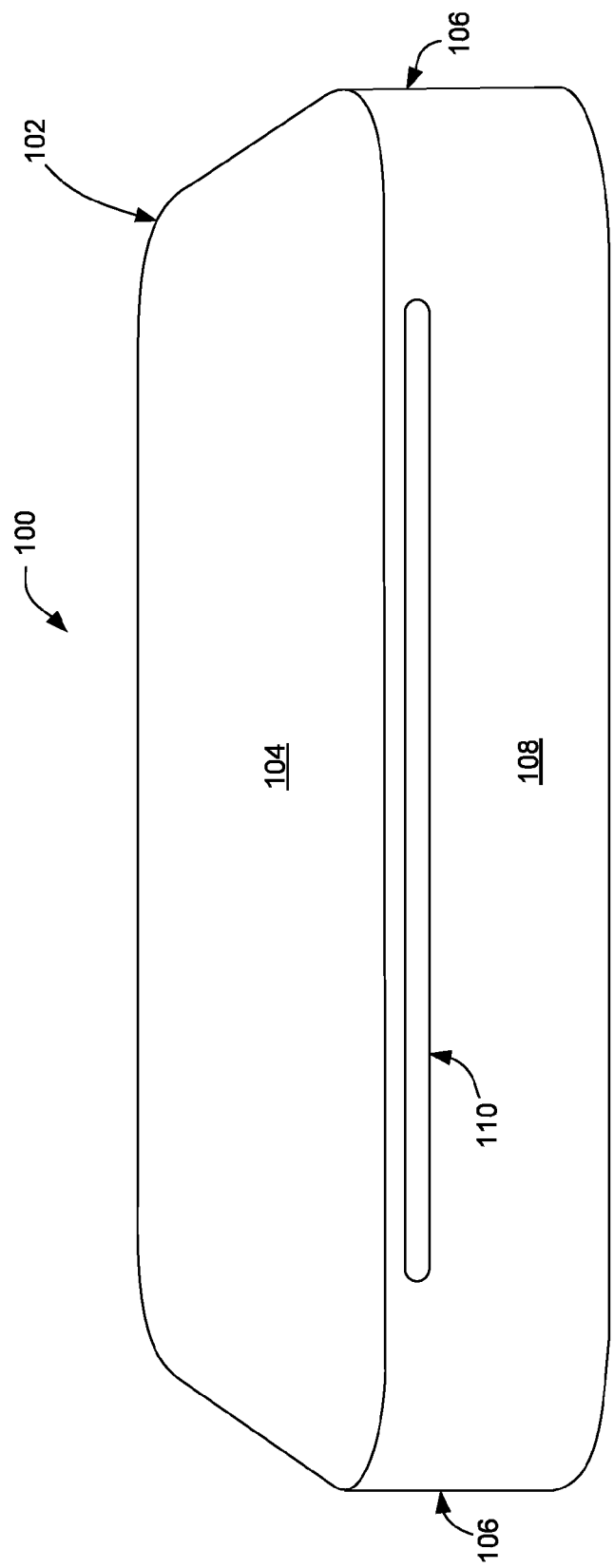
FIG. 1 shows a perspective front view of a small form factor desktop computer in accordance with the described embodiments.

In the following paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

This paper discusses an aesthetically pleasing small form factor desktop computer such as the Mac Mini™ manufactured by Apple Inc. of Cupertino Calif. that can be placed in many locations otherwise unsuitable for standard sized desktop computers. It should be noted that the term "desktop" should not be construed as limiting the location at which the computing device can be used since the computing device can be placed on a desk, shelf, and bookcase and so on.

Due in part to the simplicity of design, fewer components and less time and effort are required to assembly the small form factor desktop computer. The small form factor desktop computer can be formed of a single piece seamless housing (also referred to as a unibody housing) that can be machined from a single billet of metal such as aluminum. Due to the metallic nature as well as the lack of seams, leakage of electromagnetic radiation (EM) can be eliminated thereby helping to prevent RF leakage to the external environment as well as shielding RF sensitive internal components.

The single piece seamless housing can have a bottom portion with a support structure (hereinafter referred to as a foot) that facilitates the placement of the small form factor desktop computer. The foot can be formed of slip resistant material that is resilient and yet poses an insubstantial risk of scratching or otherwise damaging any surface upon which the small form factor desktop computer is placed. The foot can also be used as a mechanism that provides easy access to nearby internal components. In this regard, the foot can be configured for easy removal without the need for special tools other than a simple screwdriver (or even a coin) or a user's hand.

At least a portion of the foot can include RF transparent material that allows the unimpeded passage of RF energy in the support of a wireless transmission. In some cases, the foot can also be formed to include conductive materials that can provide an effective electromagnetic (EM) shield. In this way, RF sensitive circuits within the small form factor desktop computer can be protected from spurious RF signals emanating from the external environment. In addition, the RF shielding capabilities, the foot can also reduce electromagnetic interference (EMI) caused by the close proximity of the small form factor desktop computer to EM sensitive circuits, such as audio processors/receivers, etc.

The single piece seamless housing can be formed from metal, the metal can take the form of a single billet of aluminum. The single billet of aluminum can be formed into a shape appropriate for housing various internal components as well as providing various openings into which switches, connectors and so on can be accommodated. The single piece seamless housing can be machined into a desired shape. One of the advantages to using metal for the housing is ability of metal to provide good electrical grounding for any internal components requiring a good ground plane. For example, performance of a built in RF antenna can be substantially improved when a good ground plane is provided. Moreover, a good ground plane can be used to help mitigate the deleterious effects caused by, for example, electromagnetic interference (EMI) and/or electrostatic discharge (ESD).

It should be noted that throughout the following discussion, the term "CNC" is used. The abbreviation CNC stands for computer numerical control and refers specifically to a computer controller that reads computer instructions and drives a machine tool (a powered mechanical device typically used to fabricate components by the selective removal of material). It should be noted however, that any appropriate machining operation can be used to implement the described embodiments and is not strictly limited to those practices associated with CNC.

These and other embodiments are discussed below with reference to FIGS. 1-32. However, those skilled in the art will readily appreciate that the detailed description given herein with respect to these figures is for explanatory purposes only and should not be construed as limiting.

FIG. 1 shows a perspective front view of a small form factor desktop computer in accordance with the described embodiments. More specifically, FIG. 1 shows an embodiment of the small form factor desktop computer in the form of computer 100 that can process data and more particularly media data such as audio, video, images, etc. By way of example, computer 100 can generally correspond to a device that can perform as a music player, game player, video player, media center and/or the like. Computer 100 can be easily placed in a convenient location such as a desktop, shelf or small cabinet due to both the small footprint and lightweight of computer 100.

Computer 100 can include single piece seamless housing 102 formed of metal such as aluminum. The aluminum can take the form of a single billet that can be milled and further processed into a desired shape. In some embodiments, aluminum housing 102 can be anodized to provide a protective surface layer that resists scratches and corrosion maintaining an attractive metallic appearance. Housing 102 can have a substantially flat top 104 and flat side walls 106 that curve to meet front wall 108. Portions of housing 102 can be removed by a machining process such as that provided by systems that utilize computer numerical control, or CNC, to form well defined openings with tight mechanical tolerances. For example, slot 110 can be formed in front wall 108 having a size and shape in accordance with an optical disc along the lines of a CD or DVD whereas other openings can be used during assembly for placing internal components.

Housing 102 can enclose and support internally various structural and electrical components (including integrated circuit chips and other circuitry) to provide computing operations for computer 100. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on. An optical disc drive (ODD) in cooperation with slot 110 can be used to read and or write optical media such as DVDs and CDs used to store data using laser etched media whereas a hard disc drive (HDD) can include rotating disc media used to magnetically store data.

Figure 2:
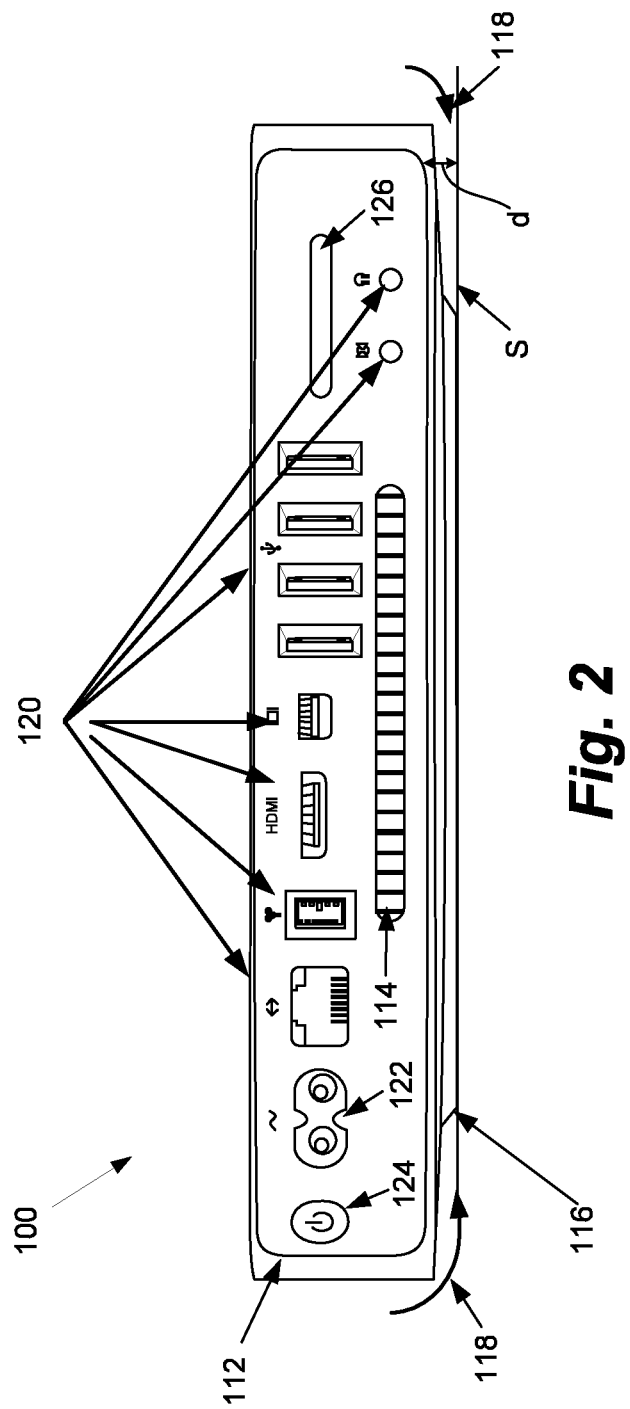
FIG. 2 shows a rear view of computer shown in FIG. 1

FIG. 2 shows a rear view of computer 100 with opening 112. Opening 112 can be formed by CNC machining techniques and can have a size and shape suitable for accommodating baffle 114 used to channel heated exhaust air from an interior of computer 100 initially drawn in from beneath computer 100 as part of an internal air cooling system. More particularly, support structure in the form of foot 116 upon which computer 100 can rest elevates computer 100 distance "d" from support surface S. Distance "d" can facilitate an intake airflow 118 that can be drawn up into computer 100 by way of an internal fan by way of air vents located in frontal portion 119 of computer 100 to provide a cooling mechanism for internal components such as a main logic board, or MLB. Once inside of computer 100, the air can absorb heat and then be forced out of computer 100 by the fan using baffle 114 as an exhaust port. In this way, the operating temperature of the internal components can remain within acceptable limits. In addition to baffle 114, a number of I/O ports 120 (HDMI, Monitor, USB, FireWire, LAN, etc.) can be accommodated within opening 112 as well as AC power receptacle 122, power button 124, memory card slot 126.

Figure 3:
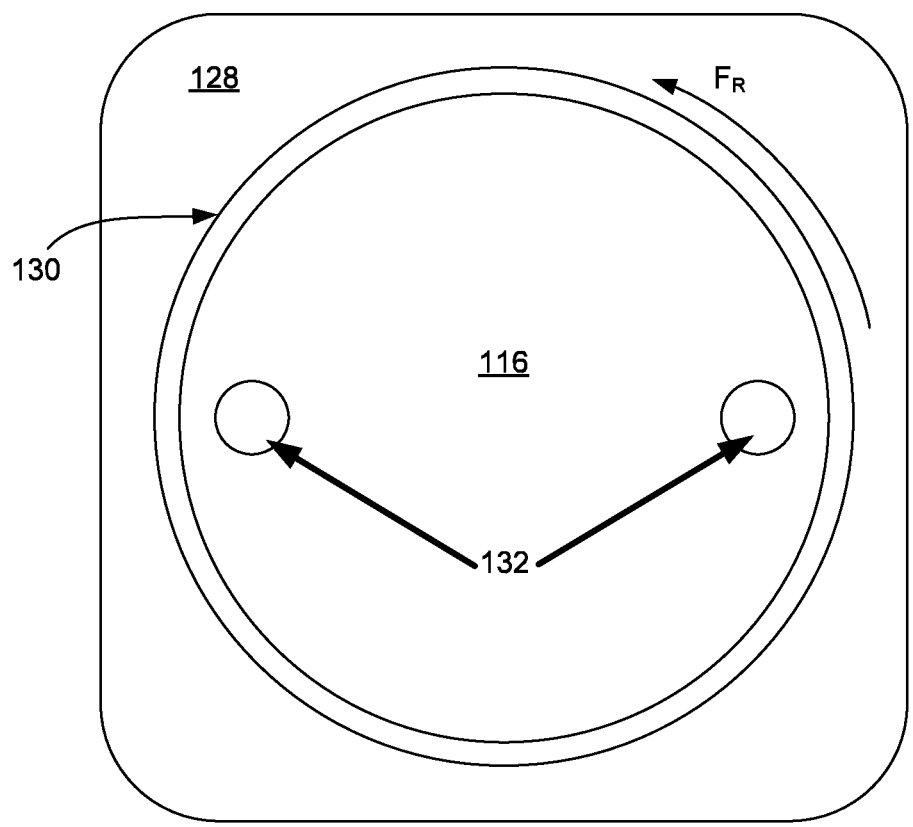
FIG. 3 shows a bottom view of a small form factor computer system shown in FIGS. 1 and 2.

At least a portion of housing 102 can be adapted to include an RF window that can be formed using radio (or RF) transparent materials. The radio transparent material can include, for example, plastic, ceramic, and so on. In this way, RF energy used for at least wireless communication can pass between internal RF circuits (such as an RF antenna) and external RF circuits in the form of RF receivers and or RF transmitters. The wireless communications can be based on many different wireless protocols including for example Bluetooth, 802.11, FM, AM, and so on. Any number of antennas may be used, which can use a single window or multiple windows depending on the needs of the system. For example, FIG. 3 shows a view of bottom surface 128 of computer 100 where a circular portion of housing 102 has been removed to form opening 130 having a size and shape to accommodate foot 116. Foot 116 can be formed of resilient material along the lines of silicone rubber or plastic having slip resistant and radio transparent properties. In this way, foot 116 can be used to support computer 100 on a surface without scratching or otherwise marring the appearance of the surface. Moreover, the radio transparent nature of the material that goes to form foot 116 does not adversely affect that ability of an internal RF antenna from sending or receiving radio transmissions.

Figure 4A:
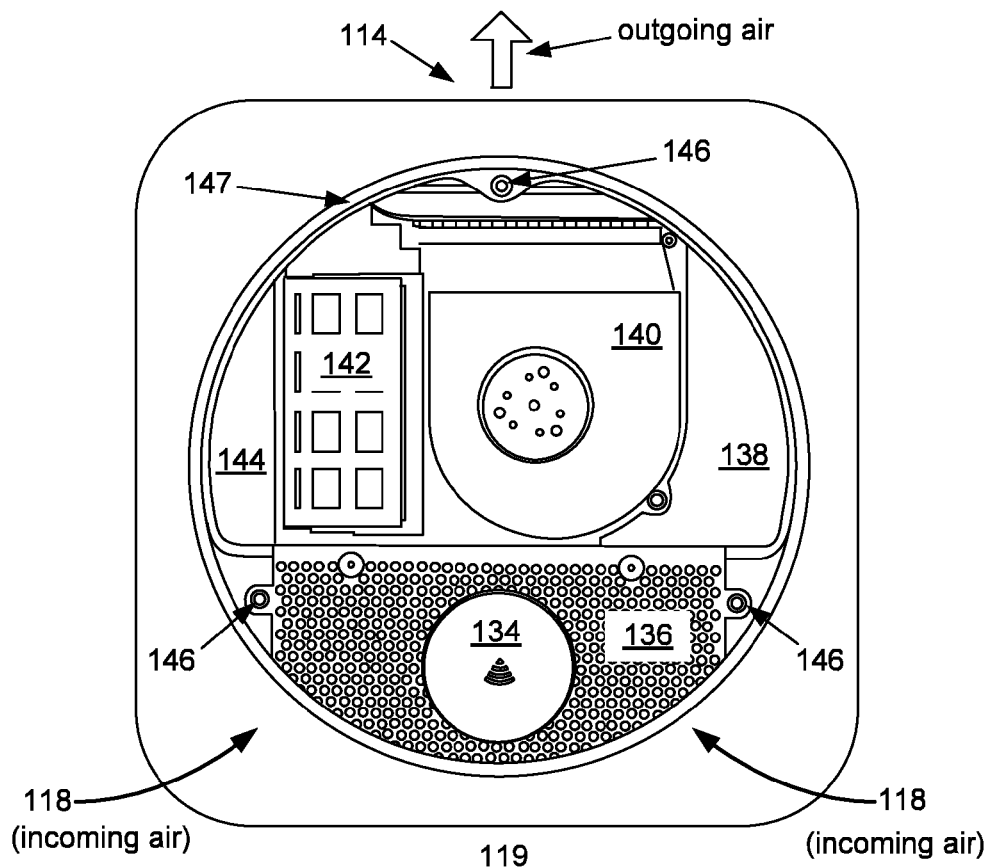
FIGS. 4A-4D shows bottom view of FIG. 3 where a foot has been removed to exposed internal components.

Foot 116 can be adapted to be easily removed by a user without requiring special tools. For example, recesses 132 can be used to place a finger or other object that can exert a rotational force $F_R$ on foot 116. Rotational force $F_R$ can be of sufficient magnitude to move foot 116 in a circular, screw like motion. This screw like motion can cause foot 116 to rotate upwards such that foot 116 can disengage from housing 102. In this way, foot 116 can be easily removed to expose nearby internal components as shown in FIG. 4A. By removing foot 116, a number of internal components can be revealed. These internal components can include RF antenna 134, antenna plate 136, cowling 138, fan assembly 140, (interchangeable) memory cards 142, and (a portion of) power supply 144. Cowling 138 can be formed of metal along the lines of aluminum or stainless steel. Cowling 138 can be used to shield internal components from EM radiation from RF antenna 134 as well as from the external environment. In combination with antenna plate 136, cowling 138 can form what is referred to as a Faraday shield between the internal components of computer 100 and the external environment preventing unwanted EM interference. In addition to providing EM shielding, cowling 138 can add structural support for housing 102 and when connected with fan assembly 140, can be used to hold down and secure a drive connector associated with fan assembly 140. Air intake 118 can be seen ingressing housing 102 at frontal portion 119 and egressing from baffle 114. In this way, relatively cool air can be drawn into housing 102 by fan assembly 140. The fan action provide by fan assembly 140 can cause coolant gas, in the form of air, to pass over a thermal transfer apparatus (shown in FIG. 4B) to receive heat generated by various internal components, and be exhausted through baffle 114.

Figure 4B:
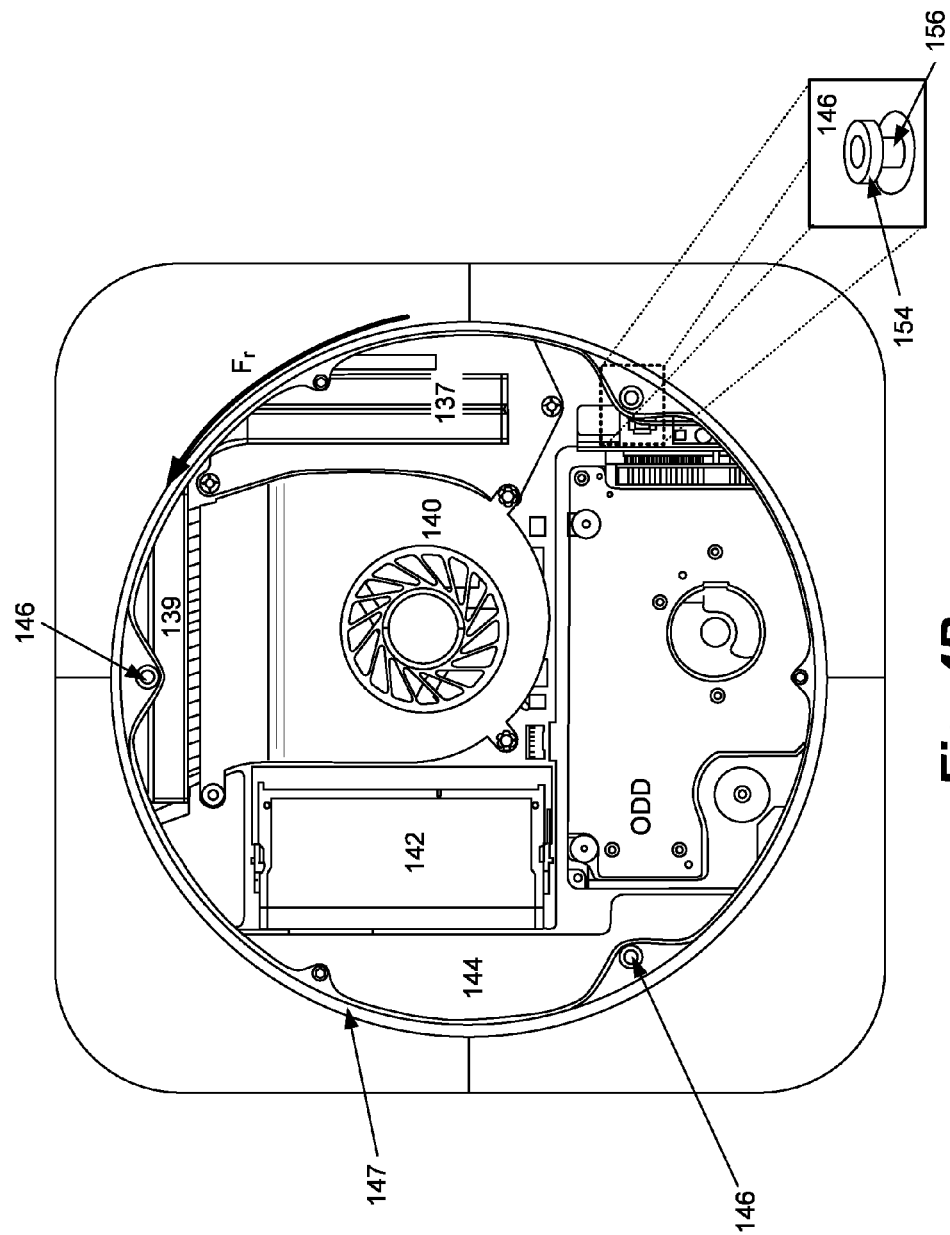

FIG. 4B shows computer 100 with both antenna plate 136 and cowling 138 removed to expose other internal components in addition to those described with regards to FIG. 4A. More particularly, RF circuitry 135 and heat transfer apparatus 137 in the form of heat pipes 137 and heat exchanger apparatus 139. It should be noted that heat transfer apparatus 139 is described in more detail in co-pending U.S. patent application entitled "Cooling Arrangement For Small Form Factor Desktop Computer" which is incorporated by reference in its entirety for all purposes.

In order to service computer 100 (i.e., swapping internal components such as memory cards 142), foot 116 can be removed by, for example, applying downward pressure $P_D$ onto foot 116. Downward pressure $P_D$ can cause spring fasteners 146 to disengage. When spring fasteners 146 are disengaged, foot 116 is free to rotate in response to the application of rotational force $F_R$ by moving in a first circular direction releasing foot 116 from spring fasteners 146. Alternatively, foot 116 can be secured to housing 102 by placing foot 116 in proximity to spring fasteners 146, applying downward pressure $P_D$ and concurrently applying rotational force $-F_R$ (in the opposite direction to that of rotational force $F_R$ used to remove foot 116) causing foot 116 to rotate in second direction, opposite to that of the first direction. In this way, special tools such as a putty knife, screw driver and so on are not required. In order to provide a good fit and finish between housing 102 and foot 116, lip 147 is contoured using CNC machining, for example, to match the contour of foot 116. In this way, the look and feel of housing 102/foot 116 is clean and appealing.

Figure 4C:
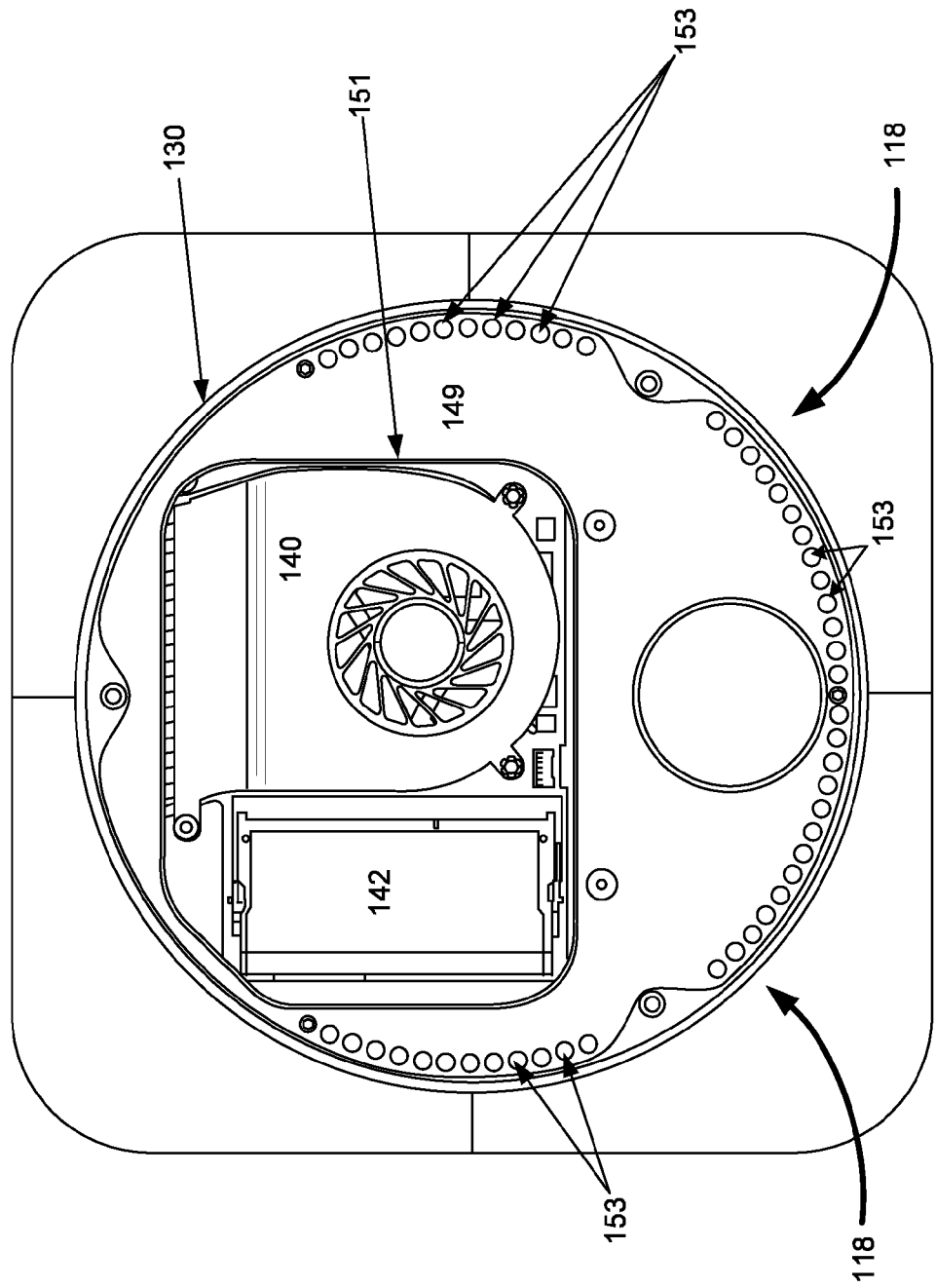
Figure 4D:
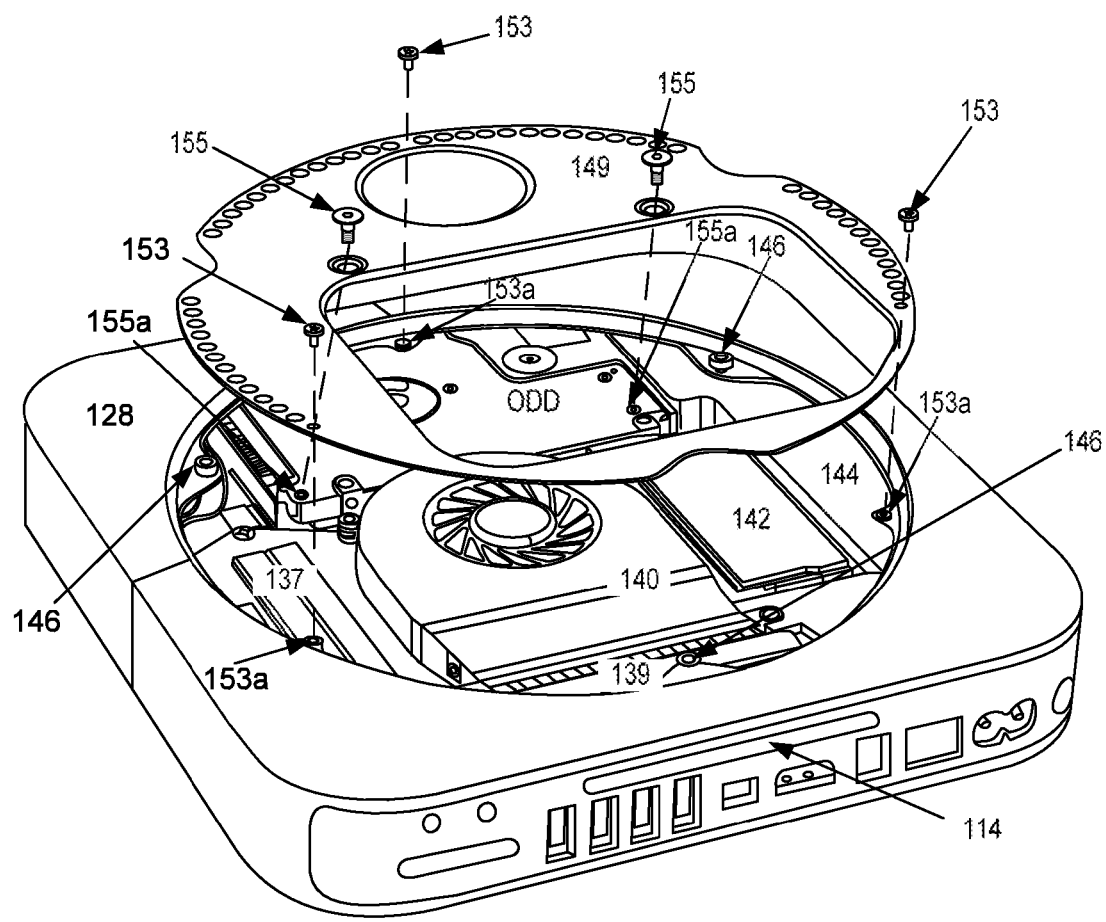

FIG. 4C shows bonnet type EMI shield plate 149 in accordance with another embodiment of the invention. EMI shield plate 149 can be formed of radio opaque material such as metal along the lines of aluminum, stainless steel, etc. As can be seen, EMI shield plate 149 can be a continuous plate of radio opaque material having central opening 151 for accessing various internal components such as fan assembly 140, memory cards 142, and power supply 144. Opening 151 can be used to provide access to memory cards 142 as well as facilitate air intake for fan assembly 140. EMI shield plate 149 can also include air holes 153 that allow passage of air flow 118 from the external environment. Air holes 153 can located in that portion of opening 130 exposed to air from the external environment. FIG. 4D shows a particular technique for attaching and detaching EMI shield plate 149 to/from housing 128 and a removable optical disc drive (ODD). Accordingly, fasteners 153 can align with and engage bosses 153a integrally formed with housing 128 and fasteners 155 with bosses 155a integrally formed with a housing of the ODD. EMI shield plate 149 can also provide additional structural support for housing 102 by spanning opening 130. In this way, a load applied to housing 102 can be transferred and distributed by way of EMI shield plate 149 to other portions of housing 102. By not concentrating the applied load at a particular region of housing 102, any potential damage such as buckling or bending resulting from the applied force can be substantially reduced if not entirely eliminated.

Figure 5:
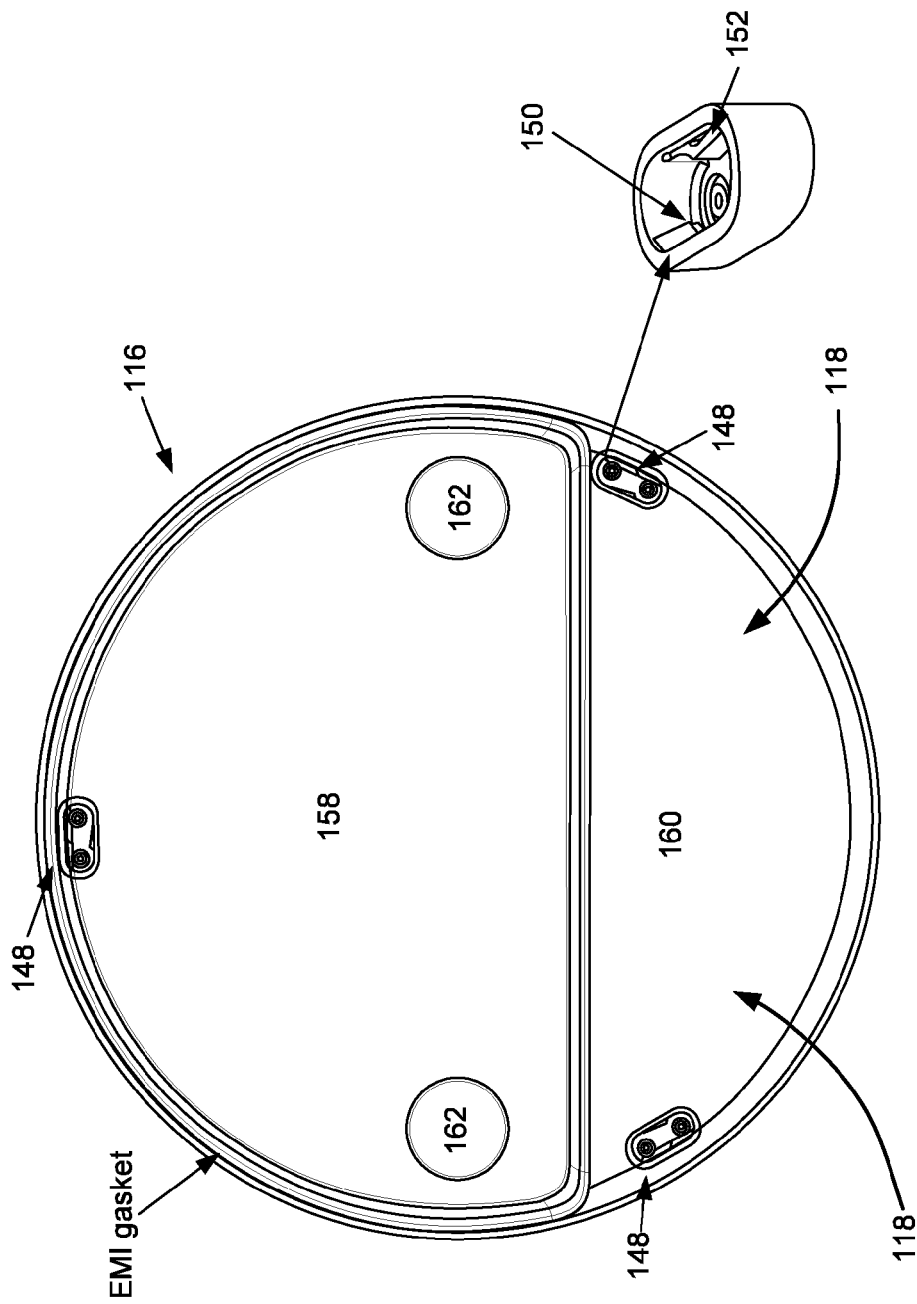
FIG. 5 shows an interior view of the foot shown in FIG. 4.

FIG. 5 shows an interior view of an embodiment of foot 116 illustrating retainers 148 configured to co-operate with spring fasteners 146 to secure foot 116 to housing 102. Retainers 148 are conformably shaped to accommodate spring fasteners 146. Retainers 148 can be shaped to include retention feature 150 and spring lock feature 152. Retention feature 150 can have a size and shape that engages with head portion 154 of spring fastener 146 and locked in place by the spring action provided by spring lock feature 152 preventing any further movement of foot 116. In order to unlock foot 116, downward pressure $P_D$ can be applied to foot 116 that compresses a spring attached to base portion 156 and head portion 154 of spring fasteners 146 (shown in FIG. 4B detailed insert). Compression of the spring causes base portion 156 and head portion 154 to move downward and away from foot 116 such that head 154 disengages from locking portion 150 allowing foot 116 to rotate. When rotated such that head portion 154 align with release portion 152, foot 116 is free to be removed completely from housing 102 in a lifting motion disengaging the locking features 150 of receptors 148 from spring fasteners 146.

In order to provide as much EM protection as possible, EMI shield 158 can be formed of metal such as aluminum or stainless steel. EMI shield 158 can align with that portion of foot 116 that does not align with antenna plate 136 in the embodiment shown in FIG. 4A. Moreover, in those embodiments that rely upon EMI plate 149, EMI shield 158 can provide EMI shielding for opening 151 shown in FIG. 4C. In this way, any components that would otherwise be exposed are afforded EMI protection from EMI emanating from the external environment as well as reducing potential EMI effects caused by EM leakage of computer 100. In order to assure a good fit and seal, EMI gasket 159 can be associated with a perimeter of EMI shield 158. EMI gasket 159 can mate with a corresponding portion of lip 147 providing an effective air seal. In this way, there is no obstruction to intake air flow 118 in that portion of foot 116 that does not include EMI shield 158. It should be noted that air holes 153 correspond to that portion of foot 116 that does not include EMI shield 158. In this way, air intake flow 118 can be well defined since any air flow leakage into or out of computer 100 is effectively prevented by the presence of the air seal created by EMI gasket 159. Therefore, portion 160 of foot 116 can be used as an air intake area suitably sized for intake of airflow 118 used to assist in the cooling of internal components of computer 100. Raised portions 162 can be coincide with recesses 132 in order to add additional depth for easier gripping of foot 116.

It should be noted that in additional embodiments, air intake openings 153 can be incorporated into a separate structure that can take the form of an air intake ring. The air intake ring can be sized to fit with opening 130. In this case, using an air intake ring can require the use of surface attachment features integrally formed with lip 147 that can engage with corresponding attachment features present on the air intake ring. For example, in one embodiment, the integrally formed attachment features can take the form of castellations having a size and shaped to accommodate corresponding connection features (such as grooves) located at attachment points on the air intake ring.

Figure 6:
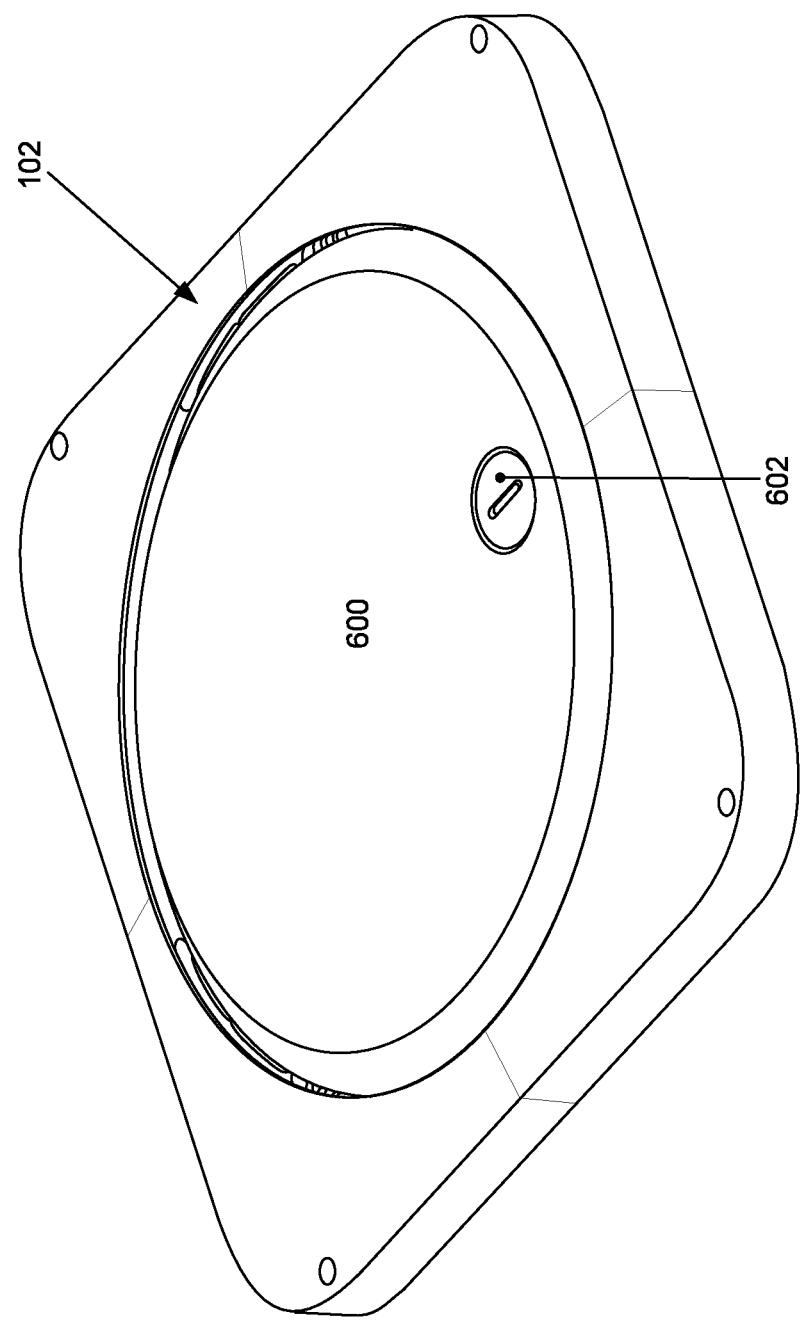
FIGS. 6, 7, 8A, 8B, 9A, 9B, 10, 11, 12, and 13 show additional embodiments of a foot.
Figure 7:
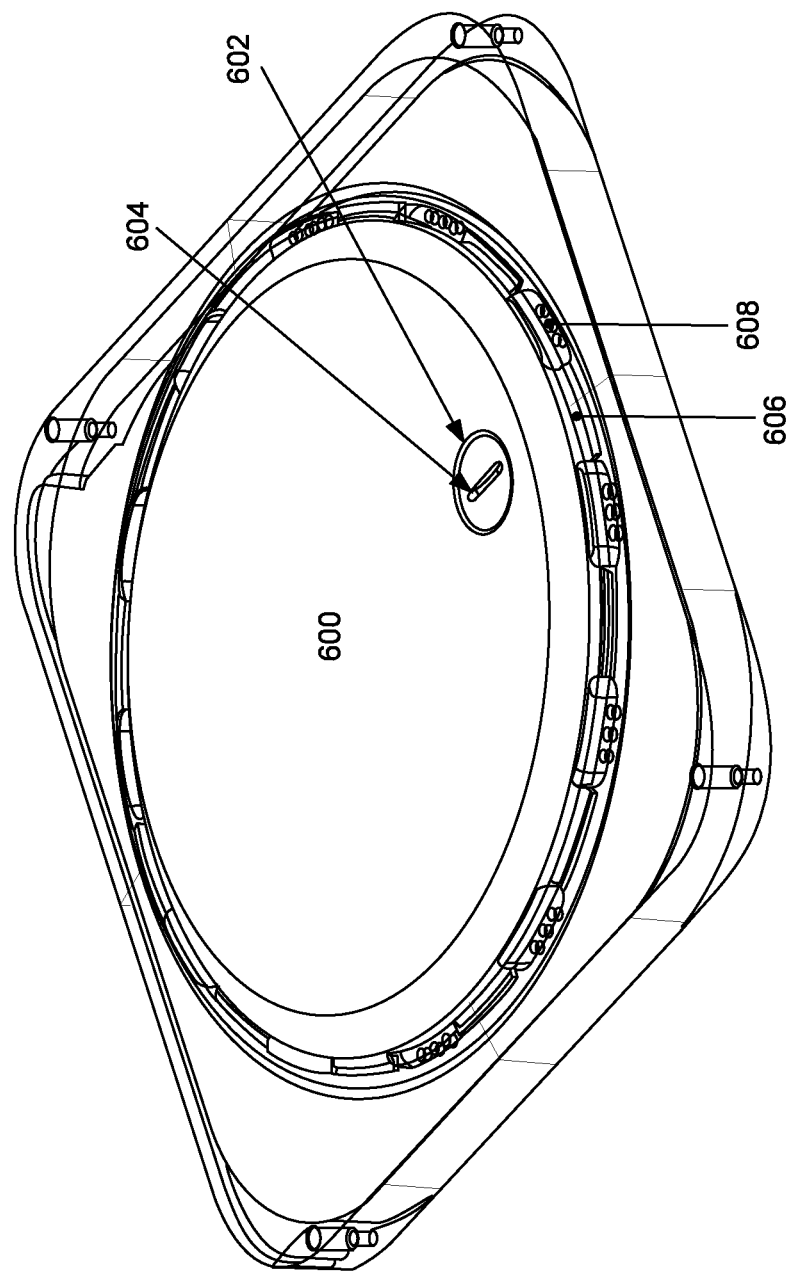
Figure 8A:
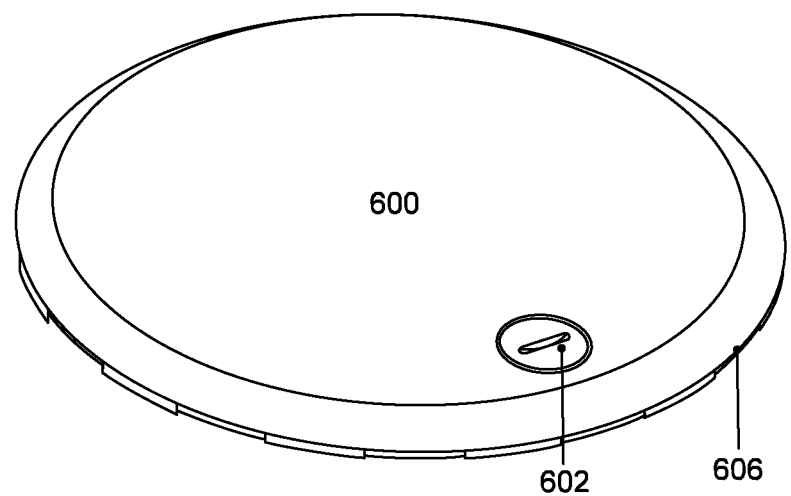
Figure 8B:
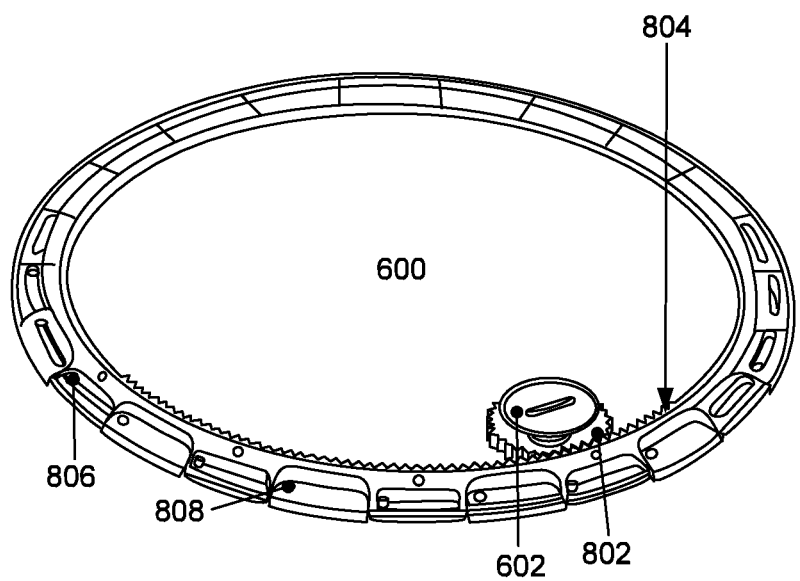
Figure 9A:
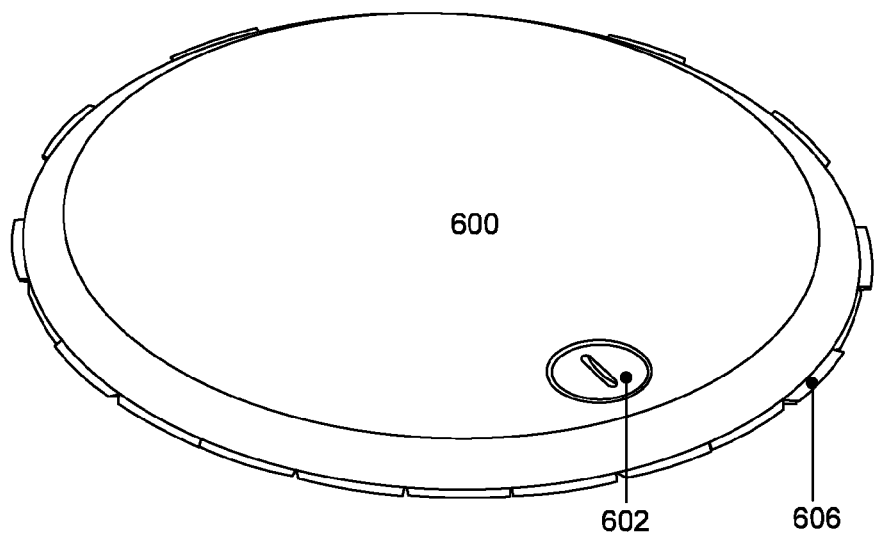
Figure 9B:
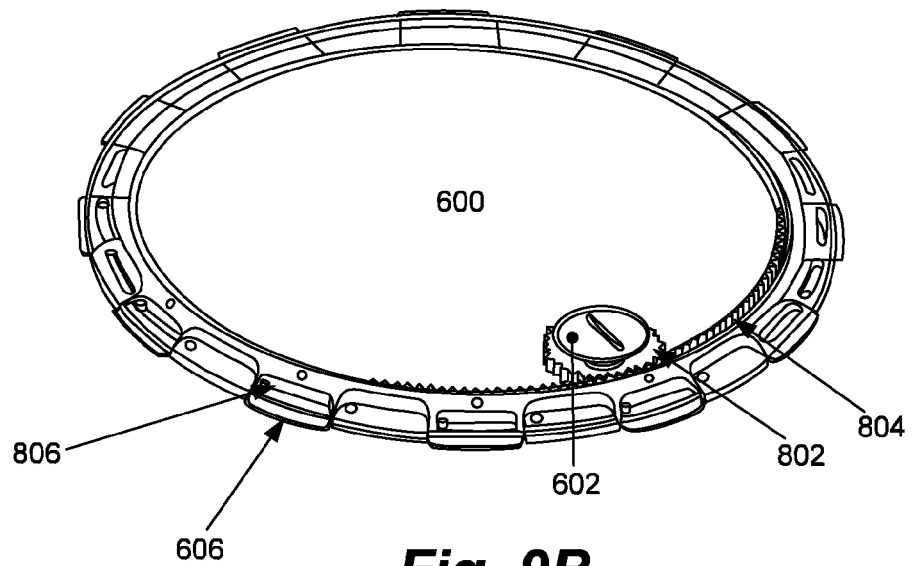

FIGS. 6-13 show additional embodiments of foot 116 well suited for use with computer 100. For example, FIGS. 6-7 show foot 600 configured to be used with an object having a slotted shape such as a coin, fingernail, etc. For example, foot 600 can include slot opener 602 having a closed/locked orientation and an open/unlocked configuration. Using slot opener 602, the coin (as a representative object having the aforementioned slotted shape) can be used to change the orientation of slot opener 602 by simply engaging the coin with corresponding slot 704 shown in FIG. 7 and applying a rotational force. For example, in the locked configuration shown in FIG. 7, a number of latches 606 can engage corresponding latching features located on housing 102 to secure foot 600. Moreover, in order to assure that there is no substantial obstruction of air intake flow 118, a number of air intake features 608 can move be positioned relative to corresponding air intake holes 153. In the embodiment shown in FIGS. 8A and 8B, in the open/unlocked configuration, slot opener 602 can be associated with an opening mechanism such as gear 802 engaged with gear 804. When slot opener 602 is positioned in the open/unlocked configuration, pin/slot mechanism 806 attached to latches 606 by way of snap fastener 808 can cause latches 606 to retract away from the corresponding latching features on housing 102. Therefore, when, as shown in FIGS. 9A and 9B, slot opener 602 is rotated from the open/unlocked configuration to the closed/locked configuration, gear 802 rotates commensurate with the rotation of slot opener 602. The gearing action of gear 802 at gear 804 causes pin/slot mechanism 806 to deploy latches 606 to engage the corresponding latching features on housing 102. In this way, foot 600 can be locked and unlocked with a simple twist of slot opener 602 using nothing more complicated that a coin or fingernail.

Figure 10:
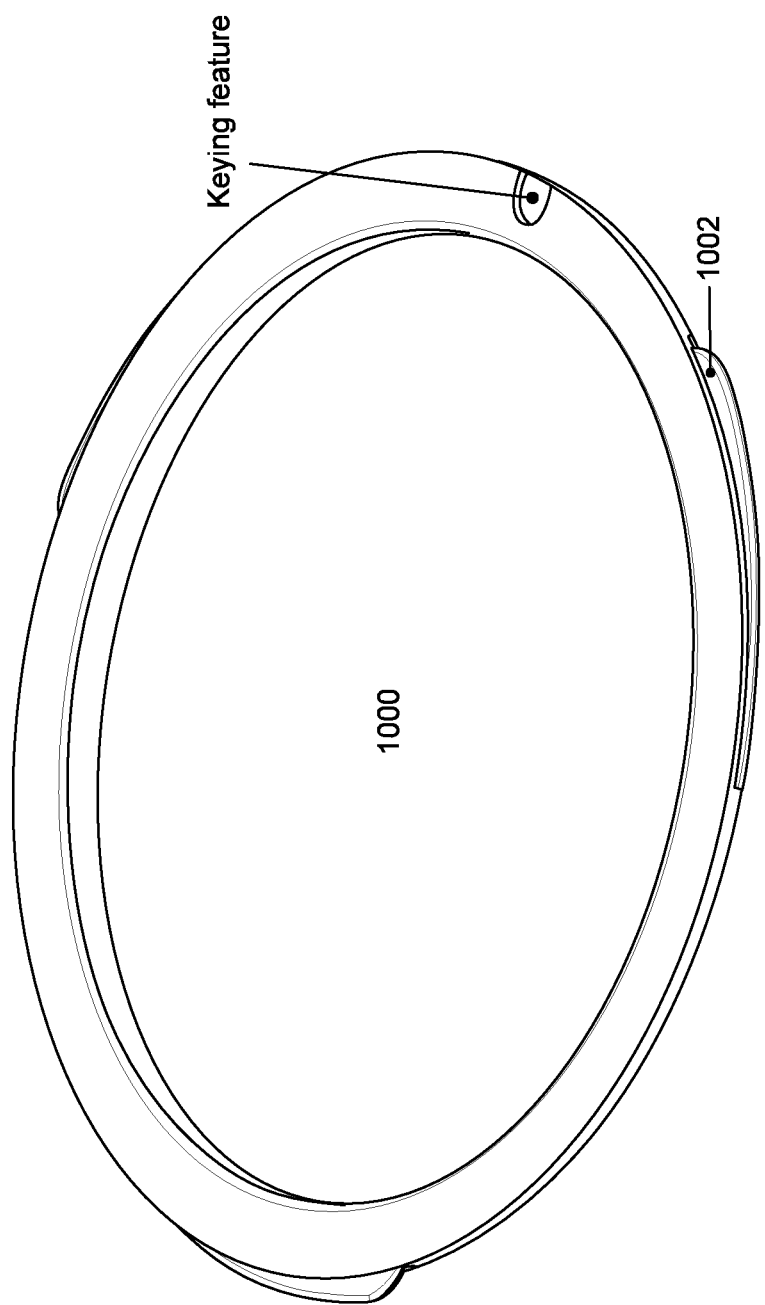
Figure 11:
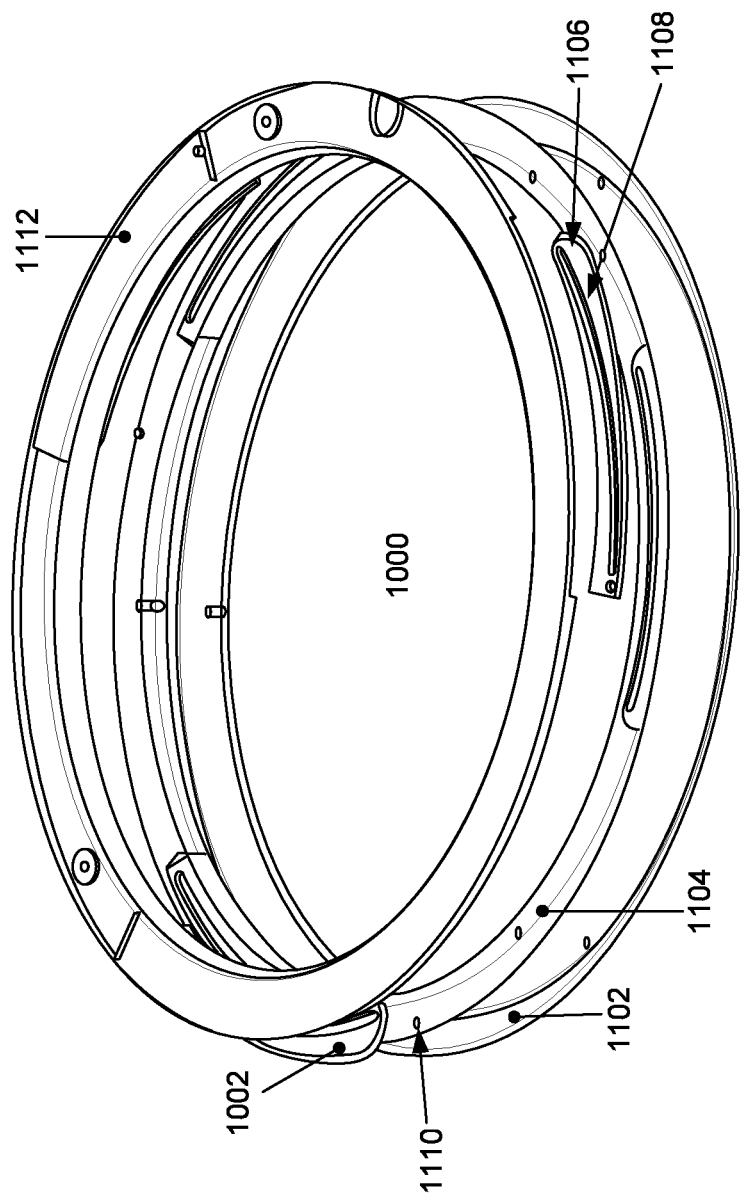
Figure 12:
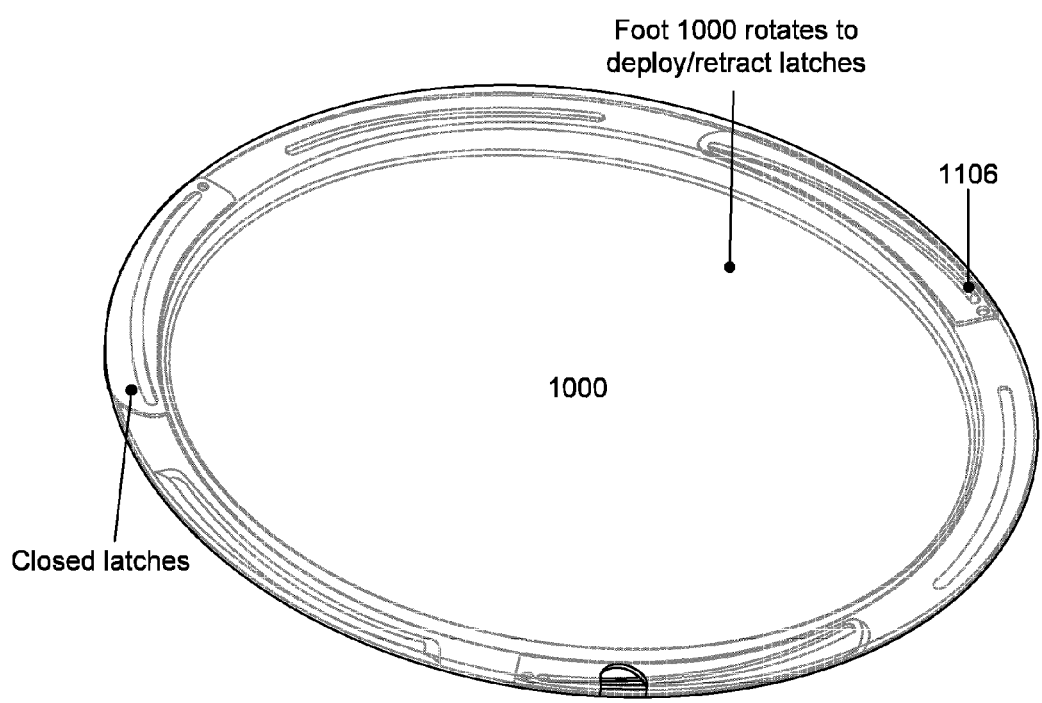
Figure 13:
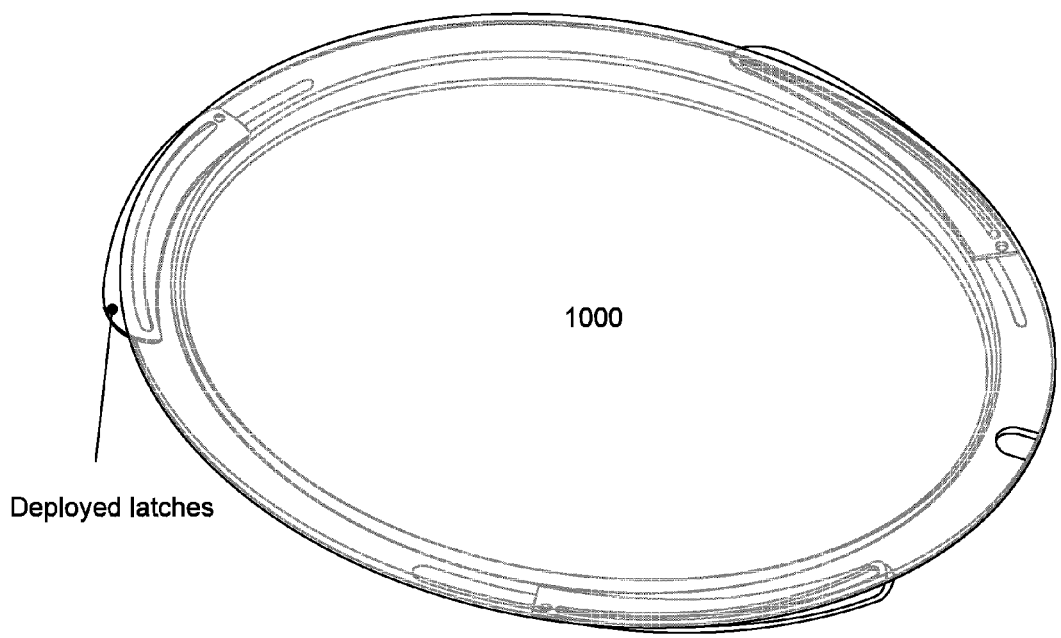

FIGS. 10-13 show yet another embodiment of foot 116 in the form of foot 1000 in accordance with the described embodiments. Foot 100 can include a number of latches 1002 as shown in FIG. 10 that when deployed can secure foot 1000 to housing 102. By deployed, it is meant that latches 1002 can extend out from foot 1000 in such as way as to engage corresponding latching features on housing 102. FIG. 11 shows an exploded view of foot 1000 showing various internal components such as foot cover 1102, base support guide 1104, pivot slot mechanism 1106 integrally formed with latch 1102. In the described embodiment, pivot slot mechanism 1106 can include slot 1108 having a curvilinear shape. Slot 1108 can engage pin 1110 on base support guide 1104 such that moving rotating foot cover 1102, pin 1110 moves within slot 1108 causing latch 1002 to deploy (i.e., move out from foot 1000) or retract (i.e., move within foot 1000). Foot 1000 can also include top support cover 1112. FIG. 12 shows foot 1000 in the unlocked configuration whereby latches 1002 are placed in the open/retracted configuration. However, in order to secure foot 1000 to housing 102, foot 1000 can be simply rotated such that pivot mechanism 1202 causes latches 1002 to deploy by as shown in FIG. 13.

Figure 14:
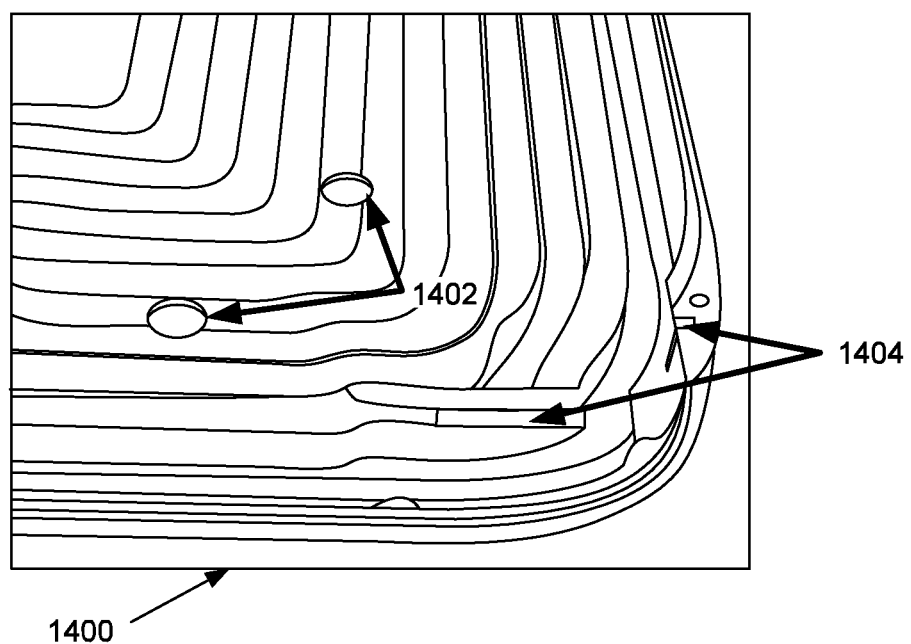
FIG. 14 shows a representative cut away view of a portion of a housing illustrating representative anchor notches and alignment notch machined directly into the housing.

One of the advantages of housing 102 is the fact that several alignment and attachment features can be formed into the interior surface of housing 102. These attachment and alignment features can be used for directly attaching a component to housing 102. In addition to providing a mechanism for directly attaching a component to housing 102, the attachment and alignment features can be used to reduce the overall assembly tolerance stack by providing anchor points that can be used to align and orient various components during assembly. For example, FIG. 14 shows a cut away view 1400 of a portion of housing 102 illustrating representative anchor notch 1402 and alignment notch 1404 machined directly into housing 102. Anchor notch 1402 can be used to anchor a component (such as the ODD) directly to housing 102. Anchor notch 1402 can also provide a good electrical contact to chassis ground since anchor notch 1402 is etched directly into housing 102. In addition, alignment notch (also referred to as a key cut) 1404 can provide a good alignment feature for components that must interface with an exterior of housing 102. For example, AC power receptacle 122 as part of the power supply must closely align with opening 112. By providing alignment feature 1404, the power supply can be fixed directly to housing 102 in such a way that the tolerance stack between the power supply/AC power receptacle 122/opening 112 can be greatly reduced By machining anchor notch 1402 directly into housing 102, anchor notch 1402 can then be used to attach an operational component, such as the ODD, directly to housing 102. Since the ODD is directly aligned with housing 102, the ODD itself can become an alignment and attachment feature for subsequently added components, such as the power supply, the HDD, the fan assembly, and so on. For example, once the ODD is attached to housing 102 using anchor notch 1402, the HDD can be installed by inserting the HDD into and through opening 112 (or opening 128 for that matter) using the ODD as an alignment feature. Moreover, once the HDD is installed, the power supply having a shape that can conform to both housing 102 and the ODD can be inserted directly into opening 112. Since the power supply has a shape that cooperates with that of the ODD and housing 102, the power supply can be "guided" into place using the previously installed components. Once properly in place, the power supply can be anchored to housing 102 using alignment notch 1404, housing 102 and the ODD.

In this way, the internal components can be sized and shaped to interlock with other already installed components in much the same way as the pieces of a puzzle are shaped to interlock with each other in a particular way to form a picture. Using the analogy of the puzzle, the internal components of computer 100 can have cooperating sizes and shapes in order to fit together presenting a high density configuration. The internal components of computer 100 can be assembled into a relatively small space using a well defined and orderly assembly process in which specific components are installed in a particular order in a specific orientation with regards to already installed components.

Accordingly, the various internal components are formed in such a way to include various interlocking features that can be user to greatly simplify the assembly process which can be analogized to assembling a ship in a bottle in that assembly can be carried out by inserting component in a particular order with a specific orientation in relation to other already installed components. Once inserted, the internal component is aligned with and at least partially secured by previously inserted components. For example, each internal component fits and aligns with other internal components. The interlocking features can also greatly reduce the number of fasteners that must be used to secure the internal components to housing 102.

Figure 15:
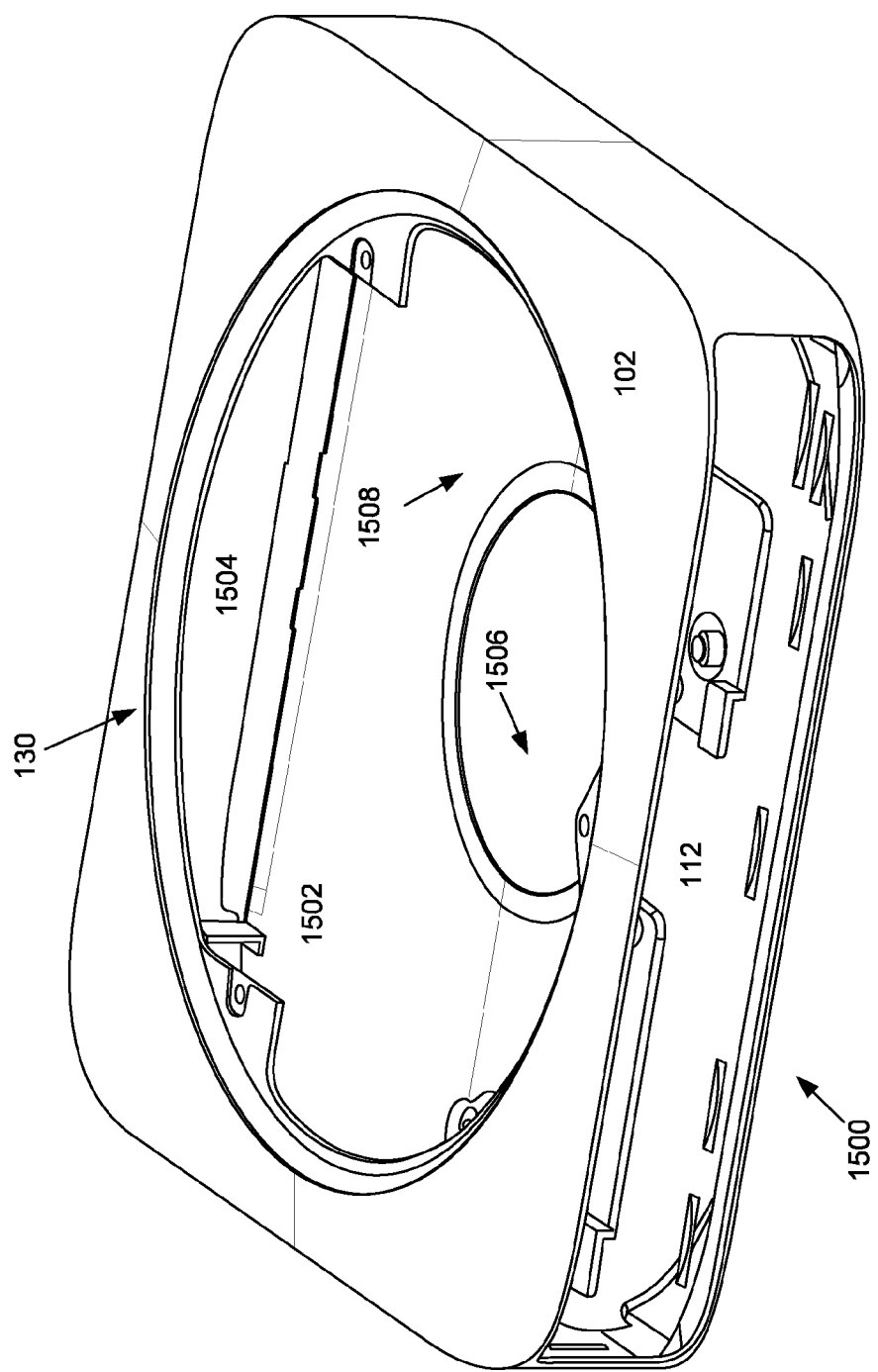
FIG. 15 shows representative interior view of a cavity (also referred to as lumen) of a housing used to enclose various internal components of a computer.

FIG. 15 shows representative interior view 1500 of cavity (also referred to as lumen) 1502 of housing 102 used to enclose various internal components of computer 100. During assembly of computer 100, various internal components can be inserted into lumen 1502 using either opening 112 or opening 130. Opening 112 can be sized to accommodate many of the larger sized internal components such as an optical disc drive (ODD), a main logic board, or MLB, and a power supply. Generally, opening 112 is sized such that the larger sized components can be inserted directly into lumen 1502 for direct mounting to housing 102 without any undue twisting and turning. For example, the ODD can be inserted directly through opening 112 in the same orientation required for attachment to housing 102. In this way, the assembly operator can easily and quickly insert and attach the ODD to housing 102. As with the ODD, other components such as the MLB and power supply can also be inserted directly into opening 112 without changing their orientation with reference to housing 102 for installation.

A number of alignment and locking features machined into or attached to the structure of housing 102 can be used to align and fasten various internal components during assembly. For example, bezel 1504 can be used to mount and align internal components such as a hard disk drive and/or optical disk drive as well as a power supply. Bezel 1504 can be attached to an inside wall of housing 102 in proximity to slot opening 110.

Bezel 1504 can be formed of resilient and shock absorbing material. In this way, any vibrations caused by one component attached to bezel 1504 (such as the ODD) can be sufficiently damped so as to not significantly affect other vibration sensitive components (such as the HDD) also attached to bezel 1504.

In order to shield internal components from externally generated electromagnetic fields, especially in those embodiments where a logo formed of radio transparent material such as plastic is formed on top surface 104 of housing 102, metal logo shield 1506 can be provided. Metal logo shield 1506 can be attached to interior surface 1508 of housing 102 using any of a number of adhesive materials such as glue. Once applied, metal logo shield 1506 can prevent electromagnetic energy from penetrating into (or out of) lumen 1502. Metal logo shield 1506 can be formed of a thin sheet of metal such as aluminum.

Figure 16:
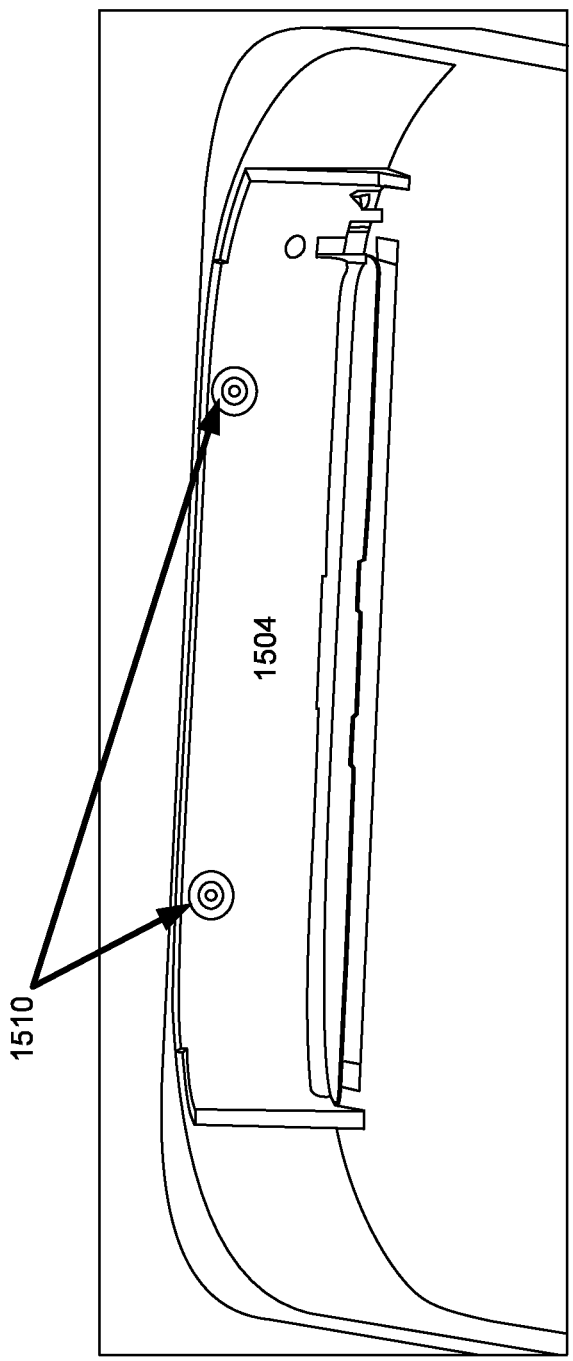
FIG. 16 shows a more detailed view of the bezel shown in FIG. 15.

As shown in more detail in FIG. 16, bezel 1504 can include several attachment and alignment features used for installing at least the optical disc drive (ODD) and the removable hard disc drive (HDD). For example, grommets 1510 can be elastomeric in nature and can be sized and located to accommodate correspondingly sized and space posts on the HDD. Since the bezel 1504 is not permanently attached to bezel 1504 using fasteners such as screws or rivets, the HDD can be easily installed and just as easily removed if necessary by merely reaching into lumen 1502, grasping and extracting the HDD. Accordingly, the HDD can be considered to be a removable HDD.

Grommets 1510 can be formed of the same or similar resilient and shock dampening material as bezel 1504. In this way, the HDD can be removably mounted to housing 102 and at the same time be isolated from vibrations generated by the ODD. The HDD effectively floats with respect to the ODD and is therefore isolated from significant vibrations generated by the rapid rotation of the optical disc. The HDD can be supported by the support pins located on a front portion of the HDD. The pins along with grommets 1506 can be used to dampen vibrations as well as to help isolate the HDD from shocks caused by sharp motions such as that experience in a drop event, for example. Damping is important consideration since vibrations can disrupt the heads used to read and write data to and from the HDD. Therefore, by using grommets 1510, there is no surface contact between the HDD and the optical disk drive, or ODD.

Figure 17:
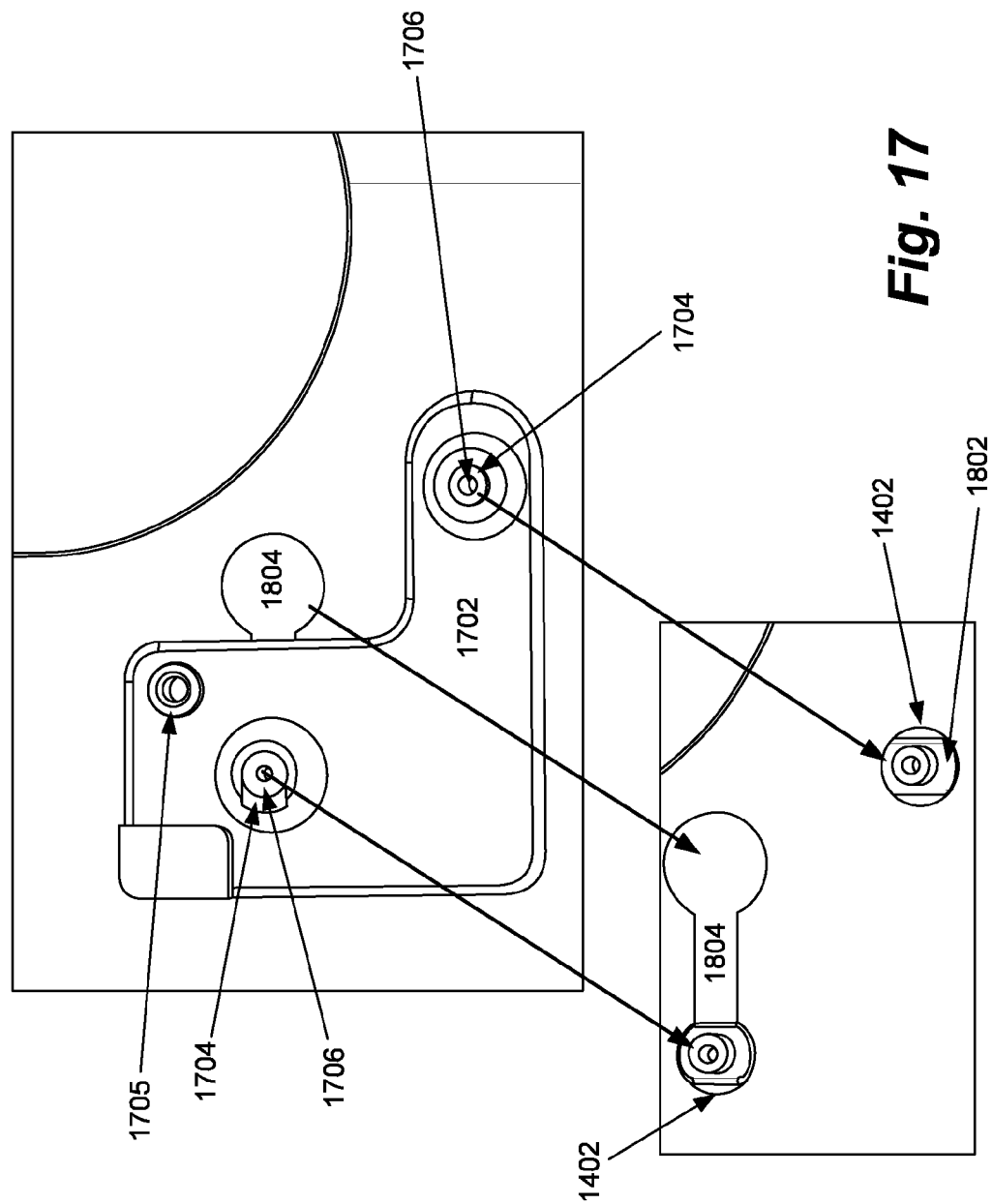
FIGS. 17-19 show representative mounting features in accordance with the described embodiments.

FIG. 17 shows lumen 1502 with mounting bracket 1702 used for mounting components directly to housing 102 in accordance with the described embodiments. Mounting bracket 1702 can include metal boss 1704 and alignment holes 1705 used for a MLB extraction tool described below. Metal boss 1704 can have a size and shape in accordance with anchor notch 1402 etched into housing 102. Metal boss 1704 can be used to securely attach an internal component (such as the ODD) directly to housing 102. In this way, those internal components mounted and secured to mounting brackets 1702 can be directly aligned to housing 102 by anchors 1402. Metal boss 1704 can include at least threaded insert 1706. Threaded insert 1706 can be used to secure an internal component to metal boss 1704 by way of a fastener such as a machine screw. In this way the internal component can be directly attached to housing 102 and used to align and mount subsequently assembled internal components.

Figure 18:
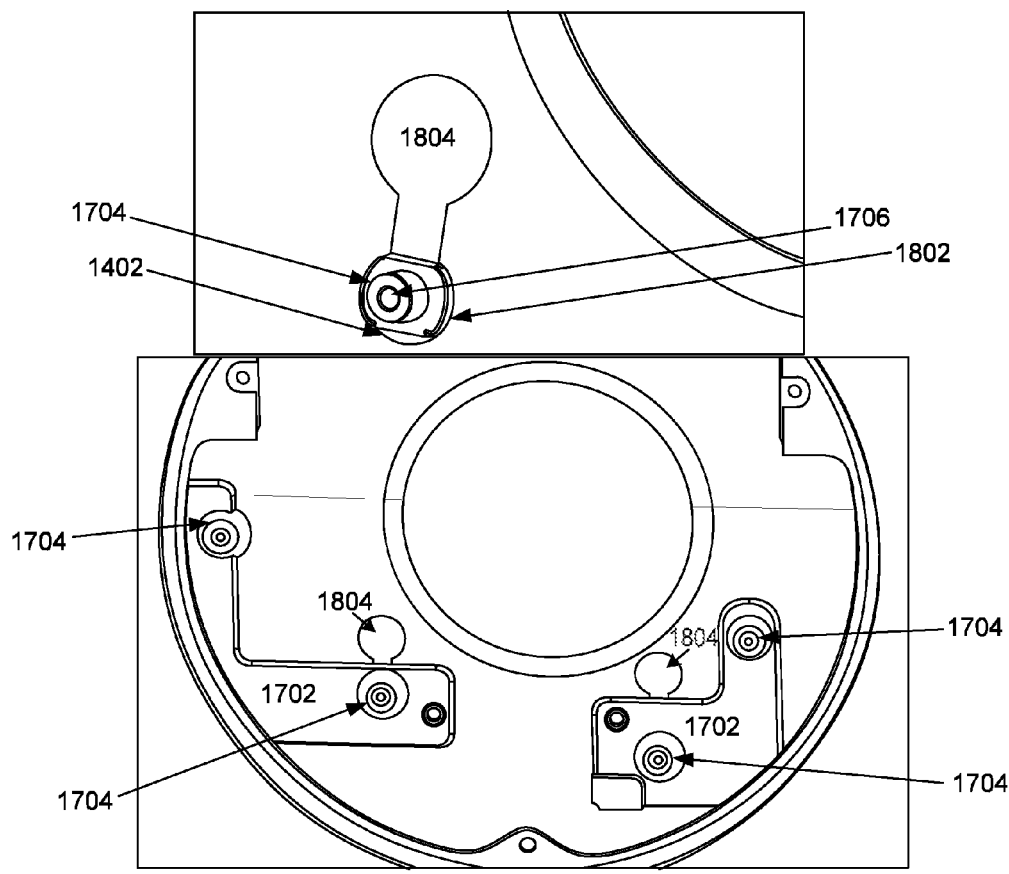

As shown in FIG. 18, mounting bracket 1702 can be aligned with and attached to housing 102 using metal boss 1704. In the described embodiment, metal boss 1704 can be aligned directly to anchor notch 1402 using metal insert 1802 that snugly fits within anchor notch 1402. In order to provide a conductive path between internal components fastened to mounting bracket 1702 and housing 102, metal insert 1802 and threaded portion 1706 can be formed as a single piece of metal. However, in order to assure that there is a good electrical contact between threaded portion 1706 and housing 102, metal insert 1802 can be attached to conductive tape 1804 using a conductive adhesive. In this way, metal boss 1704 can be considered to be electrically grounded since it is connected by way of conductive tape 1804 to housing 102. Conductive tape 1804 can take the form of metal tape such as aluminum that can be electrically connected to metal insert 1802. For example, metal tape 1804 can be wrapped around metal insert 1802, inserted through an opening formed in metal tape 1804, and so on and then attached directly to housing 102 to form a conductive path from housing 102 (as chassis ground) and threaded portion 1706 of metal boss 1702.

Figure 19:
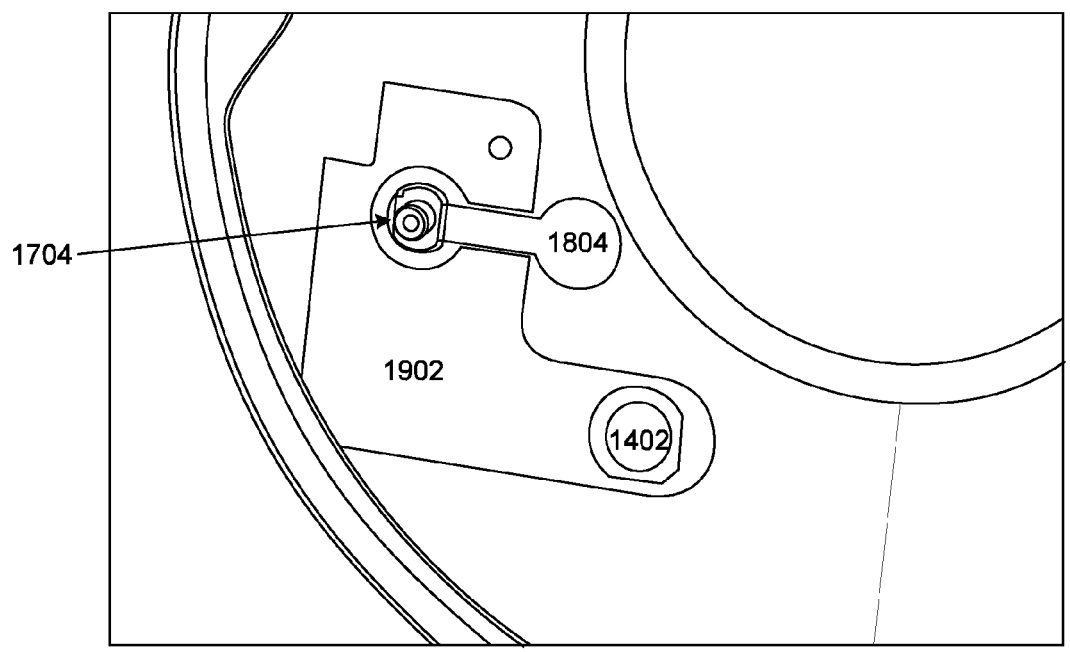

As shown in FIG. 19, in those embodiments where housing 102 is formed of anodized aluminum, portion 1902 of the interior surface of housing 102 can be ablated to remove the surface layer created by the anodizing process. For example, portion 1902 (in the approximate shape of mounting bracket 1402) of the interior surface of housing 102 can be laser ablated to expose the base layer of aluminum that constitutes housing 102. A good electrical conduction path can be established between metal threaded portion 1706 and housing 102 by way of metal tape 1804, but also by way of mounting bracket 1702. In this way, good electrical contact can be established between housing 102 and any electrical component that uses mounting bracket 1702. It should be noted that various portions of housing 102 in particular locations associated with ground tabs (also referred to as EMI fingers) can also be laser ablated in order to assure good electrical path to ground.

Figure 20:
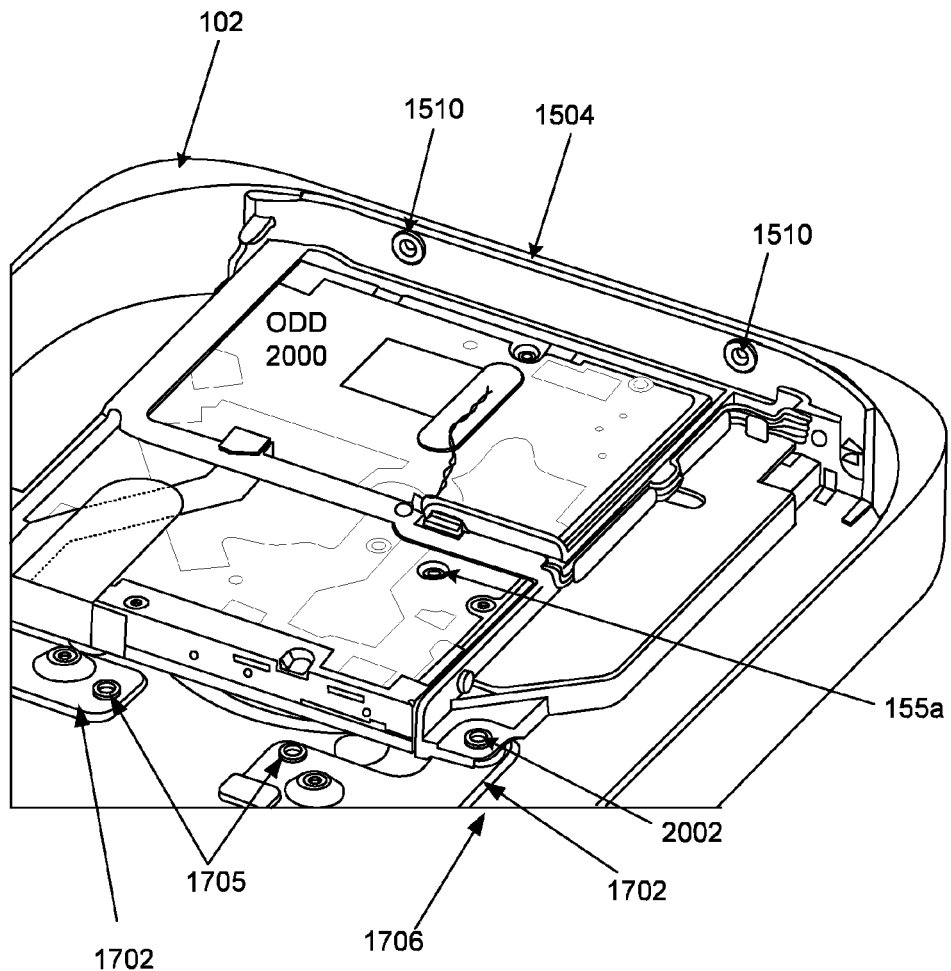
FIGS. 20-21 show representative optical disc drive (ODD) in accordance with the described embodiments.

FIG. 20 shows an embodiment where optical disc drive (ODD) 2000 can be aligned with and attached to housing 102 using bezel 1504 to align with ODD slot 110. Moreover, ODD 2000 can be attached to housing 102 by way of mounting brackets 1702. In this way, ODD 2000 can be directly aligned with and electrically grounded to housing 102. For example, ODD 2000 can include openings 2002 sized to accommodate a stacked coupler described below. The stacked coupler can have a threaded portion that can be sized to fit within opening 2002 and engage with threaded opening 1706. The stacked coupler can then be rotated until ODD 2000 is securely fastened to housing 102. In this way, not only can ODD 2000 be securely fastened to housing 102, ODD 2000 is directly aligned with a known alignment point (i.e., anchor notches 1402) and electrically grounded to housing 102.

Figure 21:
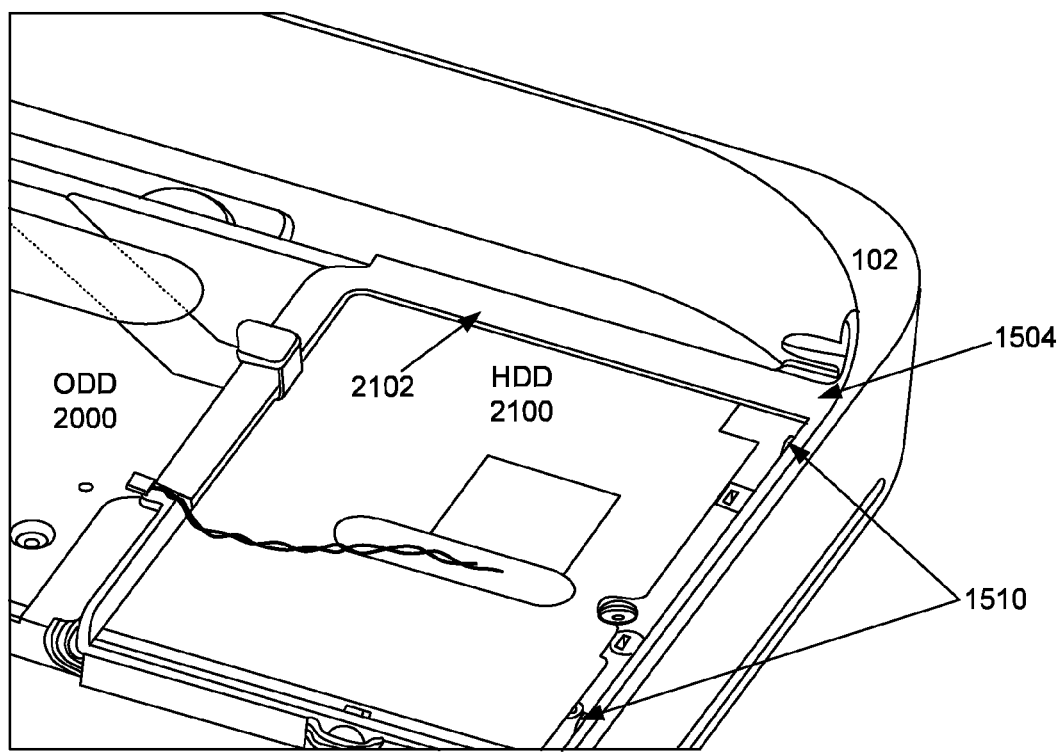
Figure 22:
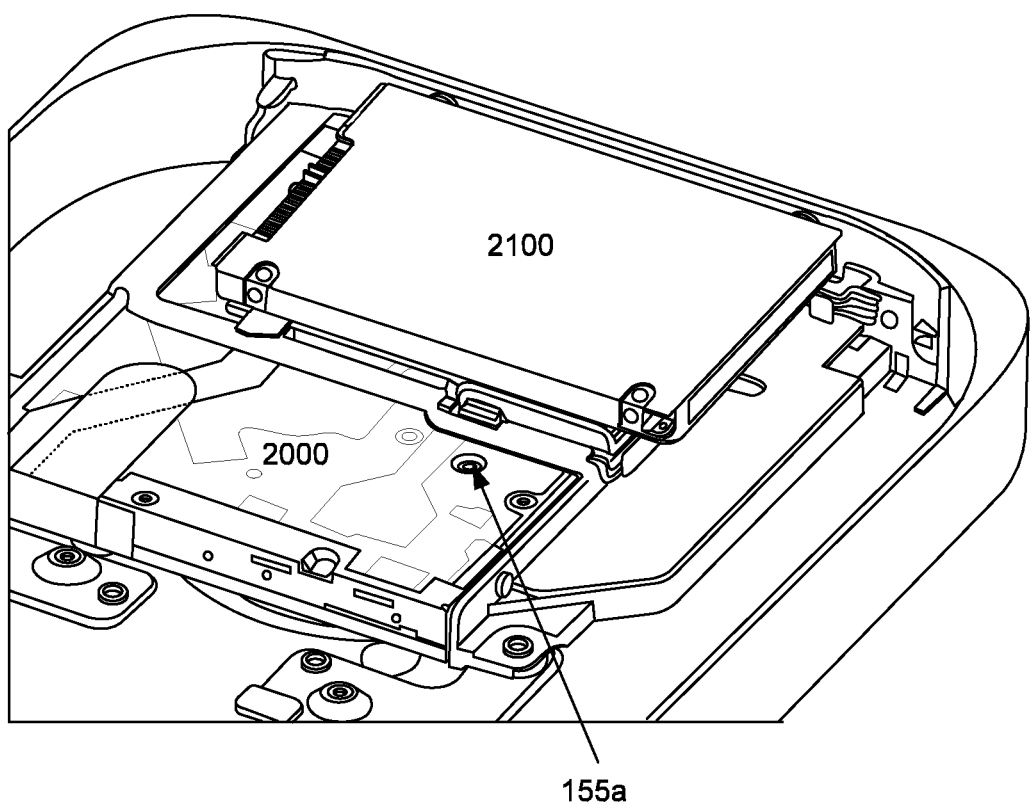
FIG. 22 shows hard disc drive (HDD) inserted into and mounted within the housing such that HDD is acoustically isolated from the ODD.

Once placed in position and securely fastened to housing 102 and bezel 1504, ODD 2000 can be used to align and mount subsequent internal components such as hard disc drive (HDD) 2100 shown in FIGS. 21 and 22. HDD 2100 can be attached to bezel 1504 by way of mounting pins inserted into grommets 1510 and supported by frame 2102. HDD 2100 can be secured to housing 102 by way of bezel 1504 without making direct surface contact with ODD 2000. In this way, any vibrations generated by an optical disc in ODD 2000 can be damped preventing vibrations from ODD 2000 from disrupting the operation of HDD 2100.

Figure 23:
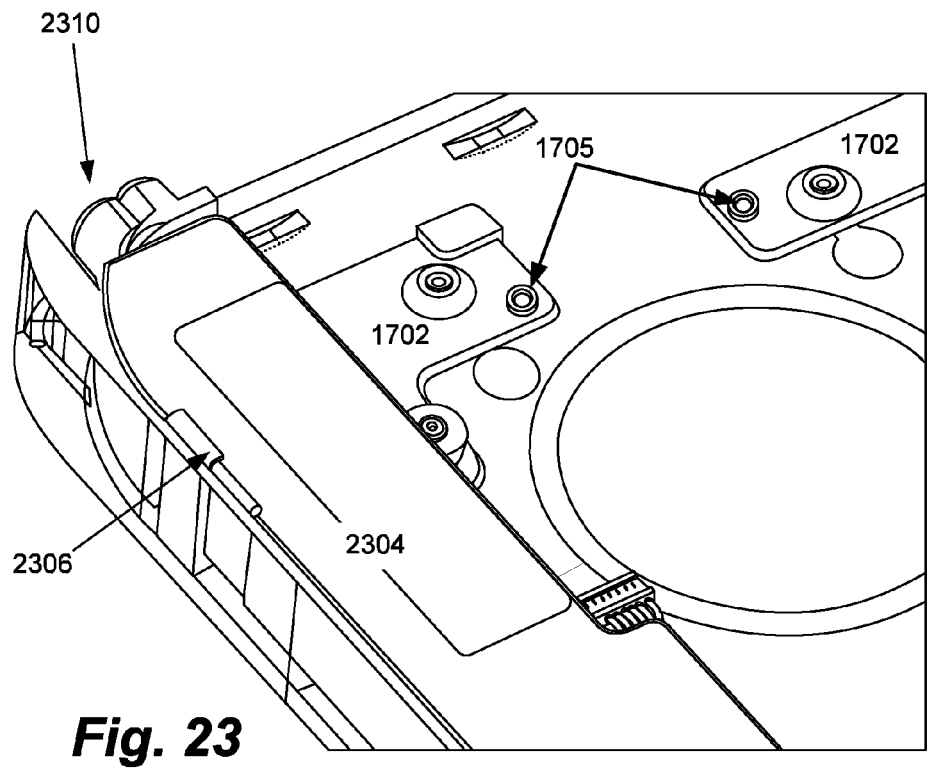
FIG. 23-24 shows representative AC power supply and technique for assembling into the housing in accordance with the described embodiments.
Figure 24:
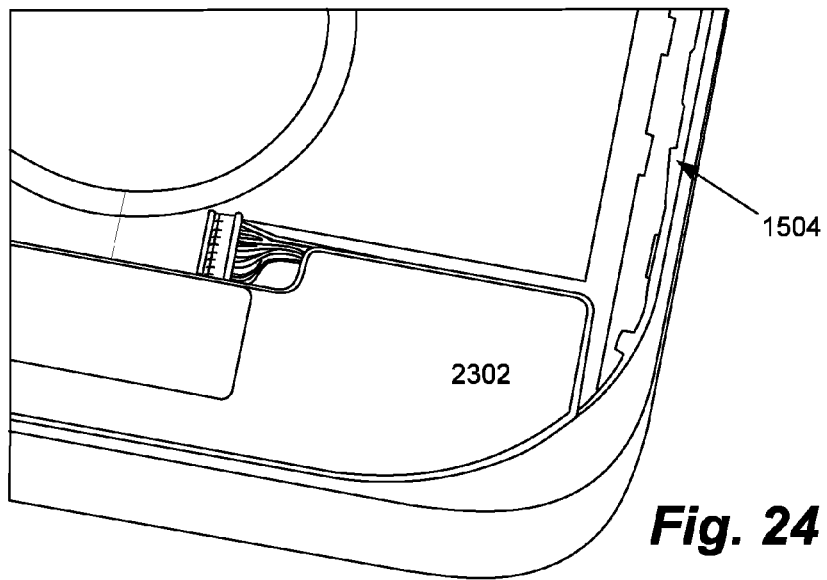

FIGS. 23 and 24 shows AC power supply 2300 in accordance with the described embodiments. As shown in FIG. 23, AC power supply 2300 can be shaped for easy installation. For example, AC power supply 2300 can be inserted "head" portion 2302 first into opening 112. (It should be noted that in actual assembly, ODD 2000 can be installed and attached prior to AC power supply 2300, however, in the example shown, ODD 2000 is left out for sake of clarity only.) Head portion 2302 can be pushed in until it engages with bezel 1504. Head portion 2302 can be shaped to match that of housing 102. In this way, AC power supply 2300 can be tightly packed within housing 102. Once head portion 2302 is firmly inserted, body portion 2304 of AC power supply 2300 can be aligned to an interior alignment feature (such as alignment feature 2306) that can be used to align AC power supply 2300 to housing 102.

Since AC power inlet 122 must retain a specific axis with regards to housing 102, and in particular opening 112, AC power inlet 122 can configured to include rotational bayonet 2310 that can be rotated into key way cut 1404. In this way AC inlet 122 can rotate into and be supported both above and below AC inlet 122 by keyway cut 1404. Moreover, by rotating bayonet 2310 into key way cut 1404, AC inlet 122 can be locked in place. In some embodiments, a locking pin (not shown) can be used to further assure that AC inlet 122 remains locked in place.

Figure 25:
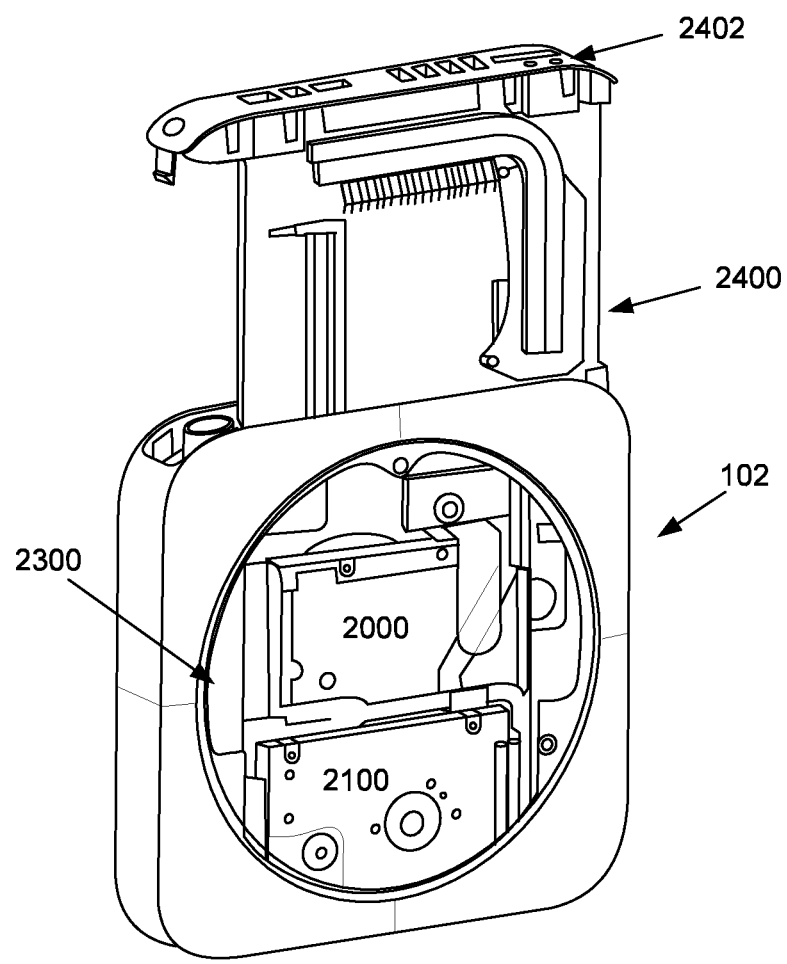
FIG. 25 shows a technique for inserting and installing a main logic board (MLB) in accordance with the described embodiments.
Figure 26:
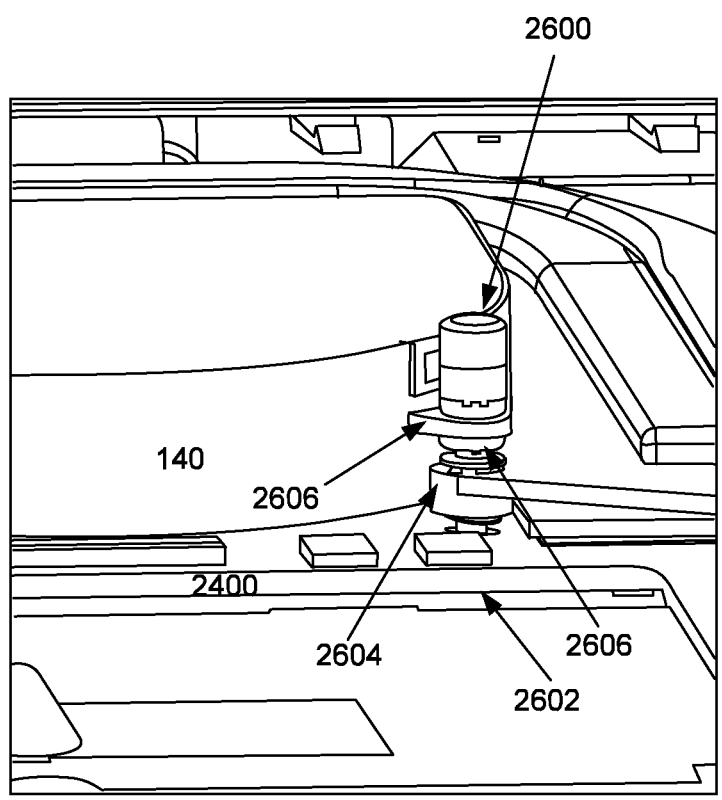
FIG. 26 shows representative stacking connector in accordance with the described embodiments.

FIG. 25 shows a technique for inserting main logic board (MLB) 2400 in accordance with the described embodiments. As discussed above, the assembly of computer 100 can be likened to assembling a puzzle or a ship in a bottle. Accordingly, MLB 2400 can be inserted into opening 112 after both ODD 2000 and AC power supply 2300 have been assembled into housing 102. MLB 2400 can be inserted into opening 112 until I/O wall 2402 aligns with opening at which point MLB 2400 can be secured to housing 102 using stacked connector 2600 shown in FIG. 26 that can also be used to anchor fan assembly 140 to MLB 2400. Stacked connector 2600 can for formed of multiple parts each formed to accommodate a particular component in a unified manner. For example, first portion 2602 can accommodate metal boss 1706 and opening 2002 to secure ODD 2000 directly to housing 102. Portion 2604 on the other hand can be sized to accommodate connector 2604 used to secure MLB 2400 to housing 102 by way of ODD 2000 and mounting bracket 1702. Portion fan assembly 140 to housing 102 by way of ODD 2000 and mounting bracket 1702. In this way, a single connector can be used to mount, secure, and align multiple components in a single operation.

Figure 27:
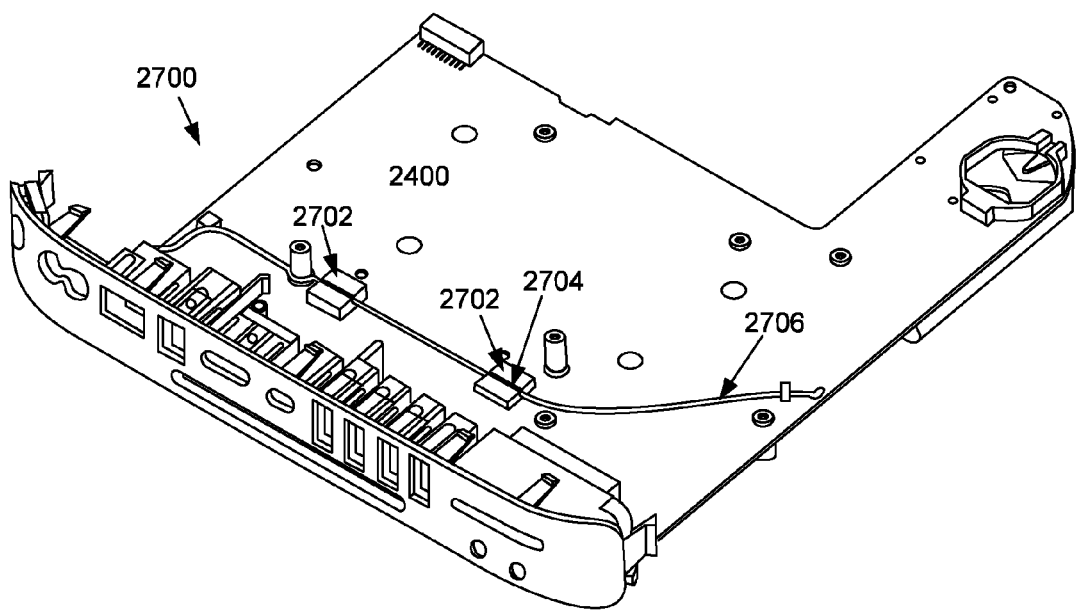
FIG. 27 shows a coaxial cable routing system in accordance with the described embodiments.

FIG. 27 shows coaxial cable routing system 2700 in accordance with the described embodiments. Cable routing system 2700 can include a plurality of stand-offs 2702 each of which can be formed of resilient material such as silicone rubber. Each of the plurality of stand-offs 2702 can include notch 2704 sized to accommodate co-axial cable. By placing each of stand-off at a particular location on MLB 2400, consistent coaxial cable routing can be achieved. Moreover, by placing the coaxial cable in notch 2704, the coaxial cable can be removed from operational circuits present on MLB 2400 reducing any electromagnetic interaction between coaxial cable 2706 and the operational circuits. Furthermore, by specifying the particular locations for the stand-offs, consistent cable routing can be achieved by assembly operations in a time can cost efficient manner. Accordingly, in one embodiment, cable routing system 2700 can include at least a plurality of non-conductive carriers used to support and route the coaxial cable on the main logic board, the carriers supporting the coaxial cable a distance removed from active operational circuits on the main logic board, the distance sufficient to reduce electromagnetic interference with the signal carried by the coaxial cable, the carriers also providing a repeatable path for laying the cable on the main logic board.

Figure 28:
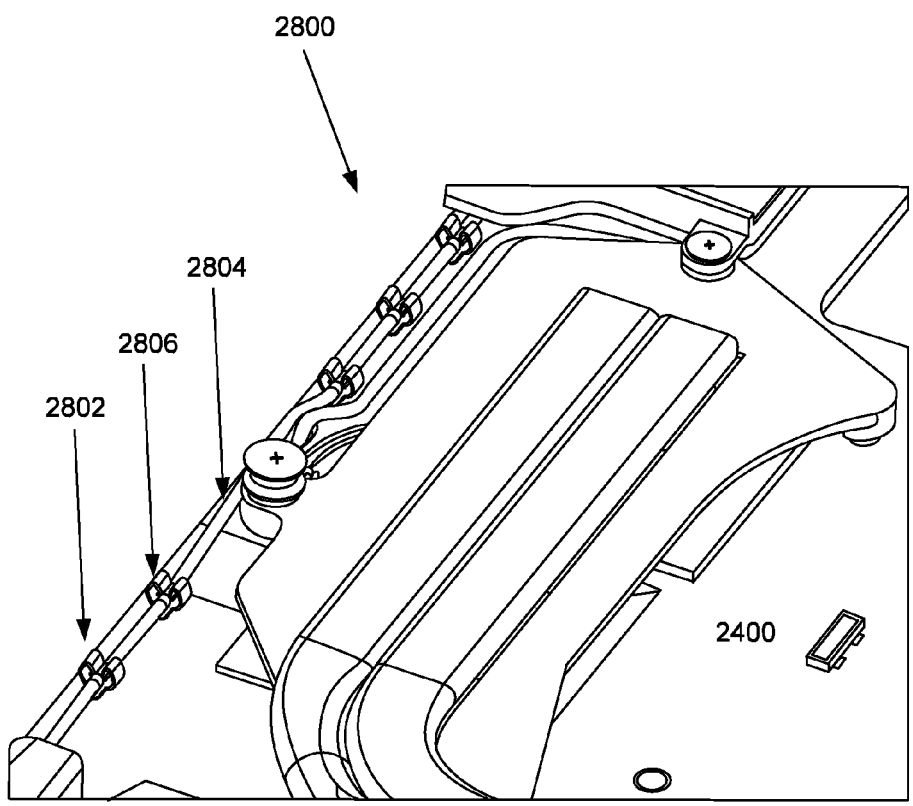
FIG. 28 shows a surface mounted ground clip in accordance with an embodiment of the invention.

FIG. 28 shows surface mounted ground clip system 2800 in accordance with an embodiment of the invention. In one embodiment, surface mounted ground clip system 2800 can include at least surface mounted carrier 2802 mounted to and electrically coupled to a printed circuit board ground of MLB 2400. Surface mounted carrier 2802 can physically support coaxial cable 2804 in a region of MLB 2400 having at least one active RF circuit. In the described embodiment, surface mounted carrier 2802 includes metallic ferrule 2806 that electrically connects a ground sheath of coaxial cable 2804 directly to the printed circuit board ground of MLB 2400. In this way, surface mounted carrier 2802 provides a distributed ground plane to coaxial cable 2804 in the region of MLB 2400 having the at least one active RF circuit.

Figure 29A:
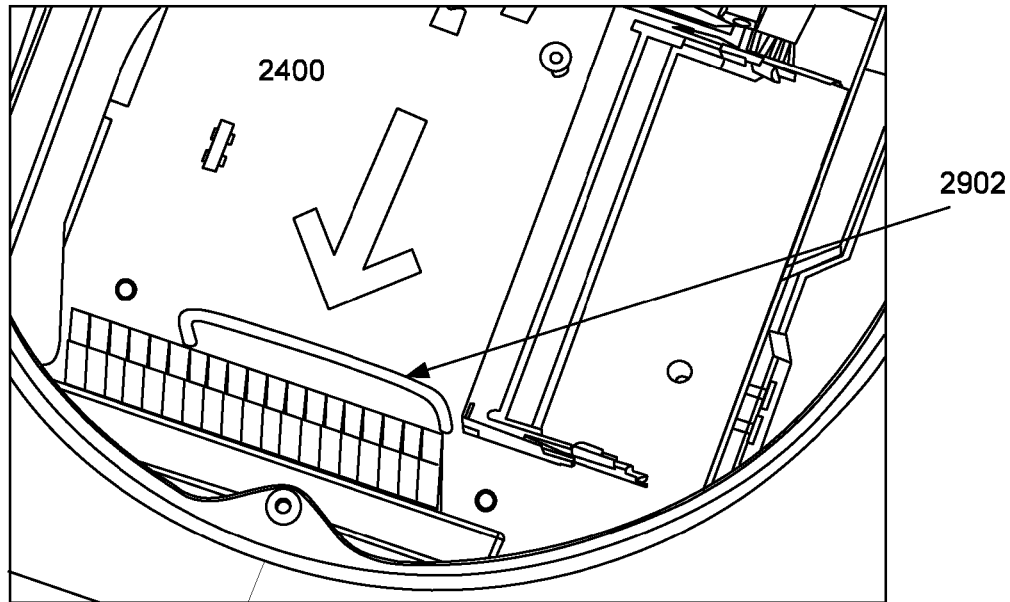
FIGS. 29A-29B shows a main circuit board extraction tool in accordance with an embodiment of the invention.
Figure 29B:
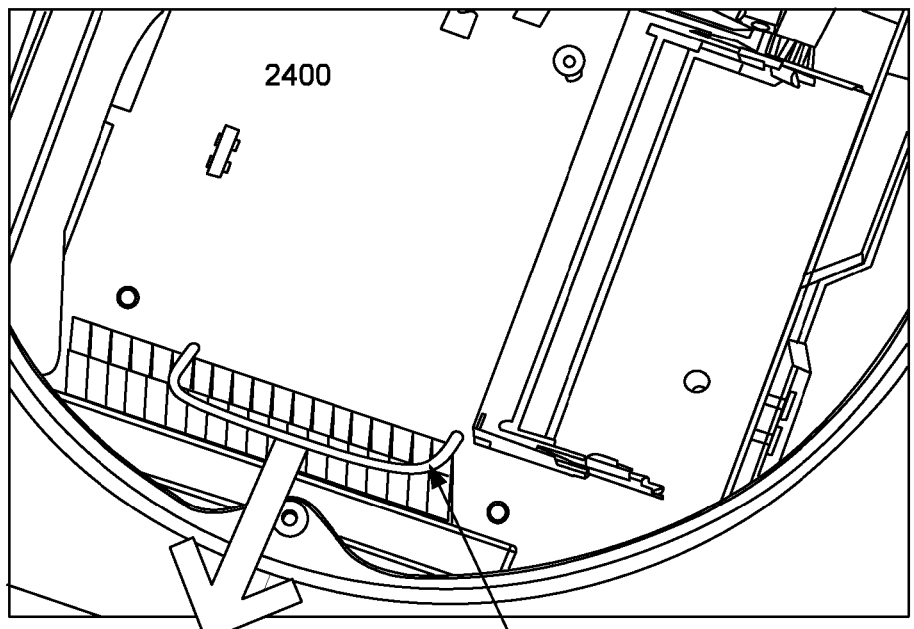

FIGS. 29A-29B show a circuit board extraction tool removing a main circuit board in accordance with an embodiment of the invention. The main circuit board extraction tool can assist a user in removing a main logic board from a small form factor desktop computer housing by engaging the main logic board with a main logic board extraction tool. In the described embodiment, the main logic board extraction tool can be formed of a single open loop of metal having open ends. The circuit board can be removed by inserting each of the open ends within a corresponding opening in the main logic board separated by a distance in accordance with the spacing between the open ends of the extraction tool until the open ends of the extraction tool inserted into the corresponding openings in the main logic board to securely engage with corresponding openings 1705 on housing 102 and generating a centrally located extraction force by exerting a lateral force in a direction of extraction to impel the main logic board to disengage an attachment feature coupling the main logic board to the housing thereby enabling a user to remove the main logic board without adversely affecting the main logic board or surrounding circuits.

Figure 30:
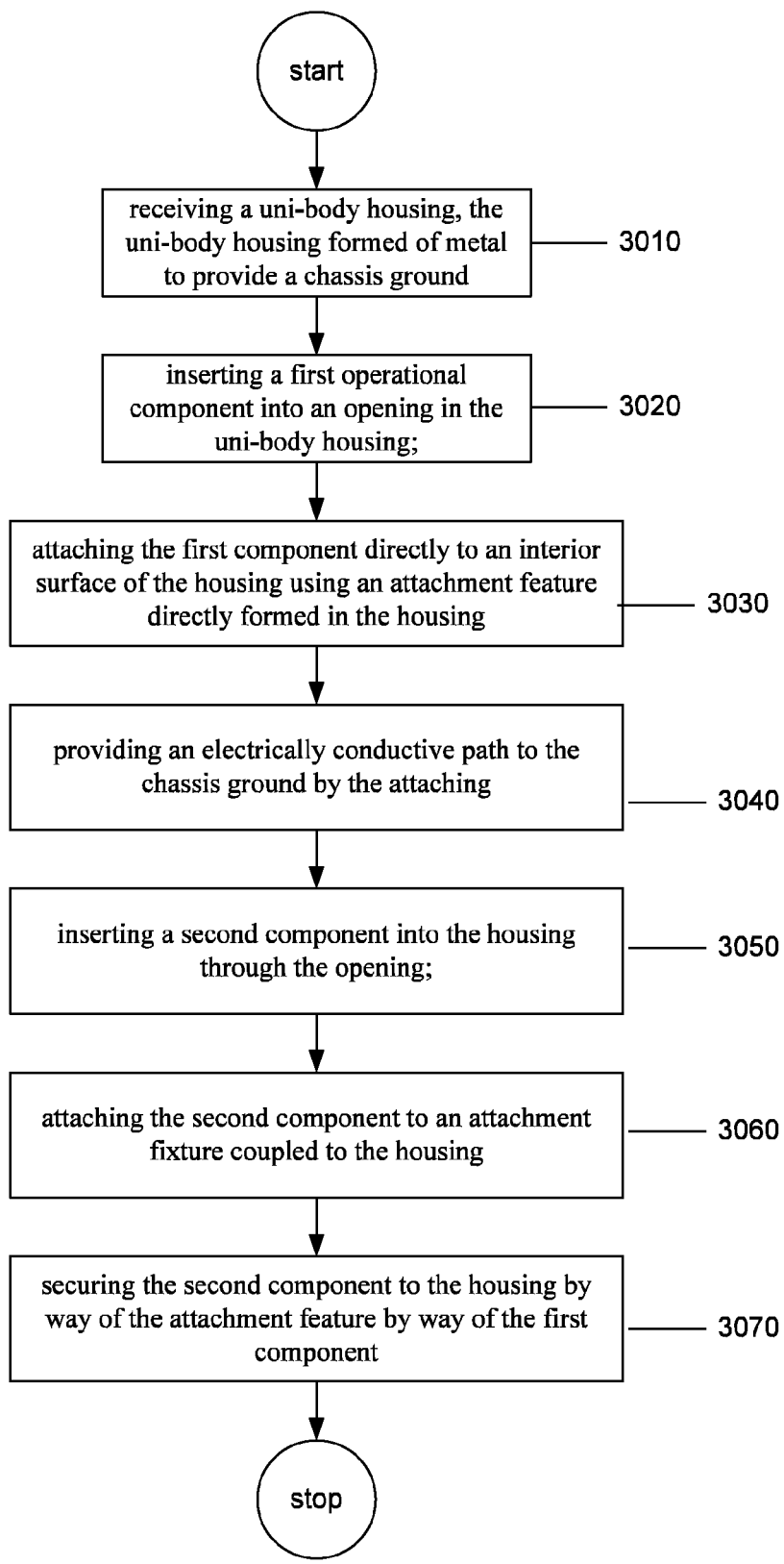
FIG. 30 shows a flowchart detailing a forming a computer housing in accordance with the described embodiments.

FIG. 30 shows a flowchart detailing process 3000 for assembly of a computer in accordance with the described embodiments. Process 3000 can begin at 3010 by receiving a housing formed of metal. In this way the metal housing can provide a chassis ground for the computer. Next at 3020, a first operational component is inserted into an opening in the housing; the first operational component can be sized in accordance with the opening such that the orientation of the first operational component remains unchanged in relation to the housing. Next at 3030, the first component is attached directly to an interior surface of the housing using an attachment feature. The attachment feature is directly formed in the housing. In this way, the attachment feature can provide a direct alignment to the housing. Accordingly, the first installed component can be used as an alignment feature for subsequently installed internal components. Next at 3040, an electrically conductive path to the chassis ground is provided to the first installed internal component. The conductive path can be provided by securing the first installed internal component to a mounting bracket electrically coupled to the housing. Next at 3050, a second component is inserted into the housing through the opening. The second component can use the first installed components as a guide for proper placement within and in relation to the housing. At 3060, the second component is attached to an attachment fixture that, in turn, is coupled to the housing. At 3070, the second component is attached to the housing by way of the first installed internal component. In this way, each installed component can act to align and secure subsequently installed components.

Figure 31:
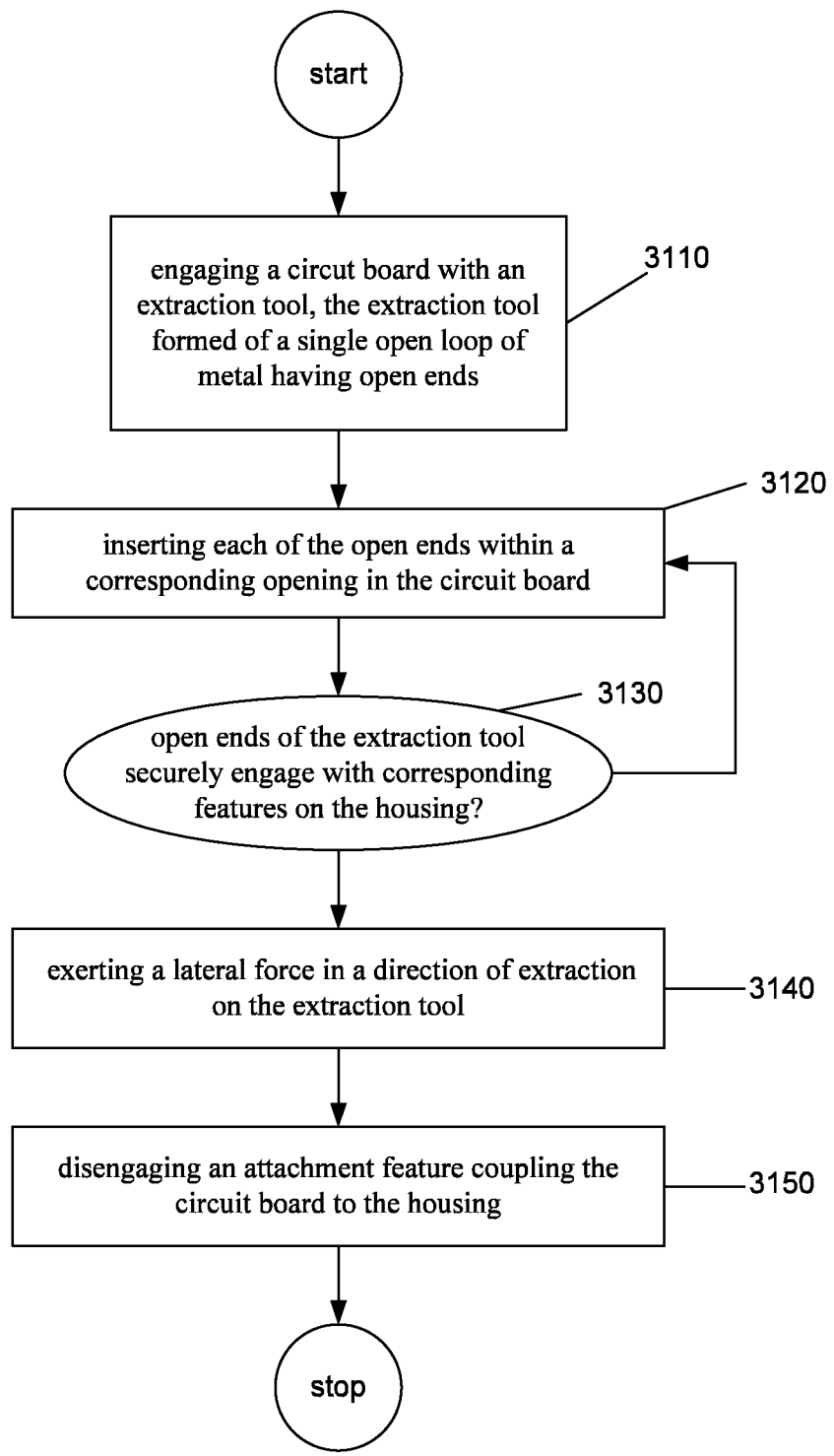
FIG. 31 shows a flowchart detailing a process for extraction of a circuit board in accordance with the described embodiments.

FIG. 31 is a flowchart detailing process 3100 for extracting a circuit board from a small form factor computer in accordance with the described embodiments. Process 3200 can be carried out by engaging the circuit board with an extraction tool at 3110. In the described embodiment, the extraction tool can be formed of a single loop of material, such as metal, having open ends. At 3120, each of the open ends is inserted into corresponding openings in the circuit board. The openings are aligned with corresponding extraction features located on an interior surface of a housing used to embody the small form factor computer. At 3130, the open ends are inserted until the open ends engage with the corresponding extraction features on the interior surface of the housing. At 3140, once engaged with the extraction feature, a lateral force is applied in the direction of the extraction and at 3150; the circuit board is disengaged from an attachment feature used to secure the circuit board in the small form factor computer.

Figure 32:
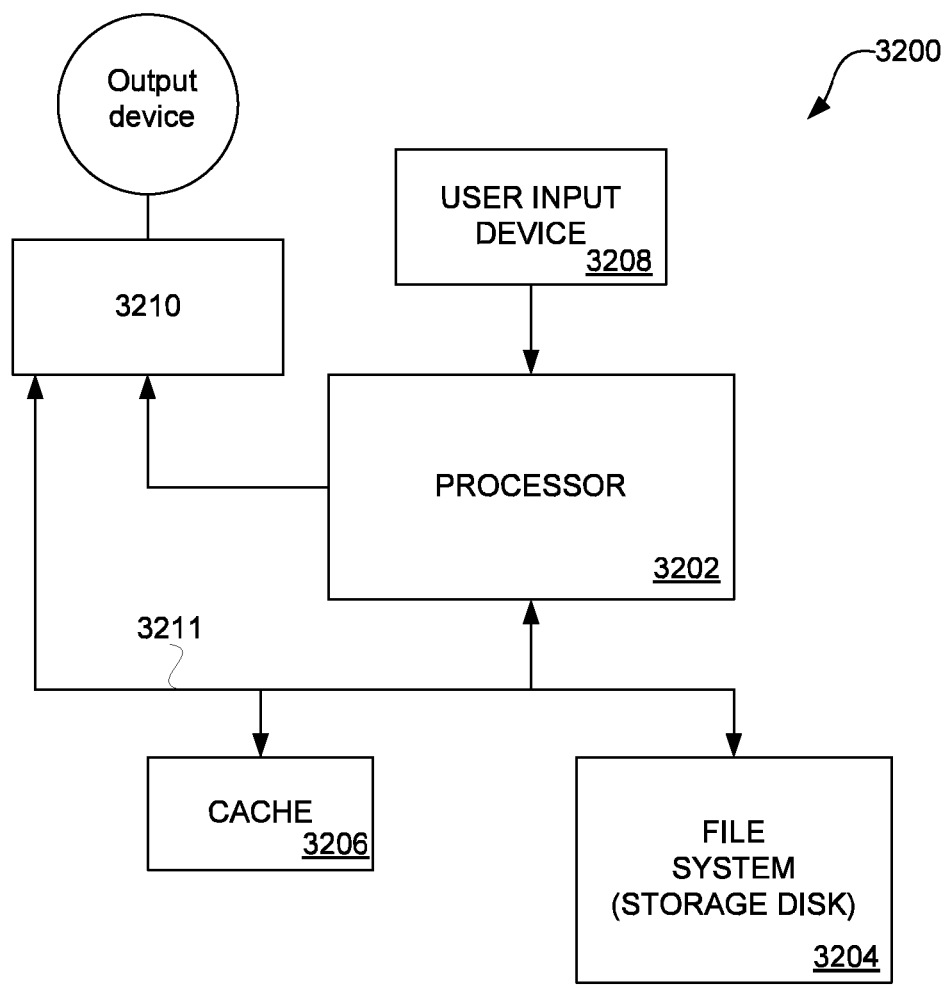
FIG. 32 is a schematic view of an illustrative computing device in accordance with some embodiments of the invention.

FIG. 32 is a schematic view of an illustrative computing device 3200 in accordance with some embodiments of the invention. Computing device 3200 can include control circuitry 3202, storage 3204, memory 3206, input/output ("I/O") circuitry 3208, and communications circuitry 3210. In some embodiments, one or more of the components of computing device 3200 can be combined or omitted (e.g., storage 3204 and memory 3206 may be combined). In some embodiments, computing device 3200 can include other components not combined or included in those shown in FIG. 32 (e.g., motion detection components, a power supply such as a battery or kinetics, a display, bus, a positioning system, a camera, an input mechanism, etc.), or several instances of the components shown in FIG. 32.

Control circuitry 3202 can include any processing circuitry or processor operative to control the operations and performance of computing device 3200. For example, control circuitry 3202 can be used to run operating system applications, firmware applications, media playback applications, media editing applications, or any other application. In some embodiments, control circuitry 3202 can drive a display and process inputs received from a user interface coupled to computer 3200.

Storage 3204 can include, for example, one or more storage mediums including a hard-drive, solid state drive, flash memory, permanent memory such as ROM, any other suitable type of storage component, or any combination thereof. Storage 3204 can store, for example, media data (e.g., music and video files), application data (e.g., for implementing functions on computing device 3200), firmware, user preference information data (e.g., media playback preferences), authentication information (e.g. libraries of data associated with authorized users), lifestyle information data (e.g., food preferences), exercise information data (e.g., information obtained by exercise monitoring equipment), transaction information data (e.g., information such as credit card information), wireless connection information data (e.g., information that can enable computing device 3200 to establish a wireless connection), subscription information data (e.g., information that keeps track of podcasts or television shows or other media a user subscribes to), contact information data (e.g., telephone numbers and email addresses), calendar information data, and any other suitable data or any combination thereof.

Memory 3206 can include cache memory, semi-permanent memory such as RAM, and/or one or more different types of memory used for temporarily storing data. In some embodiments, memory 3206 can also be used for storing data used to operate electronic device applications, or any other type of data that can be stored in storage 3204. In some embodiments, memory 3206 and storage 3204 can be combined as a single storage medium. I/O circuitry 3208 can be operative to convert (and encode/decode, if necessary) analog signals and other signals into digital data. In some embodiments, I/O circuitry 3208 can also convert digital data into any other type of signal, and vice-versa. The digital data can be provided to and received from control circuitry 3202, storage 3204, memory 3206, or any other component of computing device 3200. Although I/O circuitry 3208 is illustrated in FIG. 32 as a single component of computing device 3200, several instances of I/O circuitry 3208 can be included in computing device 3200.

In some embodiments, computing device 3200 can include specialized output circuitry associated with output devices such as, for example, one or more audio outputs. The audio output can include one or more speakers (e.g., mono or stereo speakers) built into computing device 3200, or an audio component that is remotely coupled to computing device 3200 (e.g., a headset, headphones or ear buds that can be coupled to communications device with a wire or wirelessly).

The display circuitry also can include display driver circuitry, circuitry for driving display drivers, or both. The display circuitry can be operative to display content (e.g., media playback information, application screens for applications implemented on the electronic device, information regarding ongoing communications operations, information regarding incoming communications requests, or device operation screens) under the direction of control circuitry 3202. Alternatively, the display circuitry can be operative to provide instructions to a remote display.

Communications circuitry 3210 can include any suitable communications circuitry operative to connect to a communications network and to transmit communications (e.g., voice or data) from computing device 3200 to other devices within the communications network. Communications circuitry 3210 can be operative to interface with the communications network using any suitable communications protocol such as, for example, Wi-Fi (e.g., a 802.11 protocol), Bluetooth radio frequency systems (e.g., 900 MHz, 1.4 GHz, and 5.6 GHz communication systems), infrared, GSM, GSM plus EDGE, CDMA, quad band, and other cellular protocols, VOIP, or any other suitable protocol.

In some embodiments, communications circuitry 3210 can be operative to create a communications network using any suitable communications protocol. For example, communications circuitry 3210 can create a short-range communications network using a short-range communications protocol to connect to other devices. For example, communications circuitry 3210 can be operative to create a local communications network using the Bluetooth protocol to couple computing device 3200 with a Bluetooth headset.

Computing device 3200 can include one more instances of communications circuitry 3210 for simultaneously performing several communications operations using different communications networks, although only one is shown in FIG. 32 to avoid overcomplicating the drawing. For example, computing device 3200 can include a first instance of communications circuitry 3210 for communicating over a cellular network, and a second instance of communications circuitry 3210 for communicating over Wi-Fi or using Bluetooth. In some embodiments, the same instance of communications circuitry 3210 can be operative to provide for communications over several communications networks.

In some embodiments, computing device 3200 can be coupled a host device for data transfers, synching the communications device, software or firmware updates, providing performance information to a remote source (e.g., providing riding characteristics to a remove server) or performing any other suitable operation that can require computing device 3200 to be coupled to a host device. Several electronic devices 3200 can be coupled to a single host device using the host device as a server. Alternatively or additionally, computing device 3200 can be coupled to several host devices (e.g., for each of the plurality of the host devices to serve as a backup for data stored in computing device 3200).

In another embodiment, a computer-readable medium is provided that includes computer program instructions for performing the various steps of assembly described in FIG.

32. Specifically, the computer program instruction may act to control various automatic installation components, such as, for example, robotic arms, automatic screwdrivers, etc. That can assembly the device without the need for human intervention (or, at least, minimizing human intervention). In this way, the computer instructions may be programmed to control a machine to insert various components into the housing without substantial human intervention. The computer instructions can also be programmed to control a machine to perform laser etching and laser routing in addition to any other process required for the assembly and testing of the media player.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. For example, although an extrusion process is preferred method of manufacturing the integral tube, it should be noted that this is not a limitation and that other manufacturing methods can be used (e.g., injection molding). It is therefore intended that the following appended claims be interpreted as including all such alterations, permutations, and equivalents as fall within the true spirit and scope of the described embodiments.

What is claimed is:

1. A fastening system for mechanically securing and electrically grounding an internal component to a metal housing of a computer, the metal housing including a notch having a contact surface within the notch, the fastening system comprising:

a bracket coupled with the internal component, the bracket having a boss portion suitably sized for receiving and coupling with a conductive insert, the conductive insert sized and shaped in accordance with and positioned within the notch thereby securing the bracket to the metal housing, wherein the conductive insert includes a coupling surface that is electrically coupled with the contact surface within the notch; and a flexible conductive member positioned between the bracket and the conductive insert electrically coupling the conductive insert with the bracket.

2. The fastening system of claim 1, wherein the internal component is a memory drive.

3. The fastening system of claim 1, wherein the conductive insert includes a threaded opening configured to engage with a corresponding screw.

4. The fastening system of claim 1, wherein the bracket is configured to align the internal component within the metal housing during an assembly process.

5. The fastening system of claim 1, wherein the flexible conductive member is conductive tape.

6. The fastening system of claim 1, wherein the flexible conductive member is electrically coupled to the conductive insert via conductive adhesive.

7. The fastening system of claim 1, wherein the bracket comprises a plurality of boss portions for receiving a plurality of corresponding conductive inserts that cooperate to mechanically secure the bracket to the metal housing.

8. The fastening system of claim 1, wherein the metal housing comprises an ablated portion surrounded by an anodized portion, the ablated portion having an exposed metal surface in contact with the bracket.

9. The fastening system of claim 1, wherein the bracket is coupled with the conductive insert using a fastener.

10. The fastening system of claim 9, wherein the bracket includes a first opening and the conductive insert includes a second opening, wherein first opening is configured to align with the second opening such that the fastener passed through the first opening and second opening.

11. A fastening system for mechanically securing and electrically grounding a component to a housing for an electronic device, the housing having a notch forming a contact surface within the notch, the fastening system comprising:

an insert having fitted portion and a protruding portion, the fitted portion having a shape and a size suitable for fitting within the notch and mechanically securing the insert to the housing, the insert including a coupling surface electrically coupled with the contact surface of within the notch;

a bracket configured to couple with the component and having a boss portion coupled with the protruding portion of the insert; and a conductive film positioned between and electrically coupling the bracket with the insert such that the component is mechanically secured and electrically grounded to the housing when coupled with the bracket.

12. The fastening system of claim 11, wherein the coupling surface of the insert directly contacts the contact surface within the notch of the housing.

13. The fastening system of claim 11, wherein the bracket is coupled with the insert using a fastener, wherein the bracket includes a first opening and the insert includes a second opening, the first opening aligned with the second opening such that the fastener passes through the first opening and the second opening.

14. The fastening system of claim 13, wherein the second opening is positioned within the protruding portion of the insert.

15. The fastening system of claim 13, wherein the fastening has a first threading and the second opening a second threading corresponding to the first threading.

16. The fastening system of claim 11, wherein the insert is attached to conductive film using a conductive adhesive.

17. The fastening system of claim 11, wherein the housing comprises an ablated portion surrounded by an anodized portion, the ablated portion having an exposed metal surface in electrical contact with the bracket.

18. The fastening system of claim 11, wherein the bracket comprises a plurality of boss portions coupled with a plurality of inserts, the plurality of inserts positioned within corresponding plurality of notches formed within the housing, wherein the plurality of inserts cooperate to secure the bracket to the housing.

19. The fastening system of claim 11, wherein the protruding portion of the insert passes through a conductive film opening within the conductive film.

20. The fastening system of claim 19, wherein the conductive film includes a tab portion that extends from the conductive film opening.

* * * * *